US010779427B2

(12) United States Patent
Lee et al.

(10) Patent No.: US 10,779,427 B2
(45) Date of Patent: Sep. 15, 2020

(54) METHOD FOR MEASURING ELECTROMAGNETIC SIGNAL RADIATED FROM DEVICE AND ELECTRONIC DEVICE THEREOF

(71) Applicant: Samsung Electronics Co., Ltd., Suwon-si, Gyeonggi-do (KR)

(72) Inventors: Youngbae Lee, Suwon-si (KR); Seungwoo Lee, Suwon-si (KR); Seungnyun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/683,692

(22) Filed: Nov. 14, 2019

(65) Prior Publication Data

US 2020/0154583 A1    May 14, 2020

(30) Foreign Application Priority Data

Nov. 14, 2018    (KR) .................. 10-2018-0139747

(51) Int. Cl.
*H05K 5/02*    (2006.01)
*G01N 27/90*    (2006.01)
(Continued)

(52) U.S. Cl.
CPC ......... *H05K 5/0247* (2013.01); *G01N 27/904* (2013.01); *H04M 1/0202* (2013.01); *G06F 1/163* (2013.01)

(58) Field of Classification Search
CPC combination set(s) only.
See application file for complete search history.

(56) References Cited

U.S. PATENT DOCUMENTS 5,398,280 A  *  3/1995  MacConnell ........... H04L 51/38
                                                379/110.01
7,392,948 B2 *  7/2008  Smith .................. G06Q 10/087
                                                235/383
(Continued)

FOREIGN PATENT DOCUMENTS

JP         2000-65876 A     3/2000
KR     10-2015-0106535 A    9/2015
(Continued)

OTHER PUBLICATIONS

International Search Report and Written Opinion Report dated Mar. 2, 2020, issued in International Application No. PCT/KR2019/015576.

*Primary Examiner* — Lisa Lea-Edmonds
(74) *Attorney, Agent, or Firm* — Jefferson IP Law, LLP

(57) ABSTRACT

A method for measuring an electromagnetic (EM) signal radiated from an external electronic device and an electronic device thereof are provided. The electronic device includes a housing, a display, a first conducting unit, a second conducting unit, at least one EM sensing circuit, at least one wireless communication circuit, a processor, and a memory. The memory stores instructions of when being executed, enabling the processor to receive, by using the first conducting unit, a first signal sensed by the EM sensing circuit, and receive, by using the second conducting unit, a second signal sensed by the EM sensing circuit, and provide a signal pattern on the basis of the first signal and the second signal, and identify an external electronic device, at least partially on the basis of the signal pattern.

20 Claims, 22 Drawing Sheets

(51) Int. Cl.
    *H04M 1/02*     (2006.01)
    *G06F 1/16*     (2006.01)

(56) References Cited

U.S. PATENT DOCUMENTS

| | | | |
|---|---|---|---|
| 7,699,226 B2* | 4/2010 | Smith | G06Q 10/087 |
| | | | 235/451 |
| 9,646,489 B2* | 5/2017 | Cho | H05B 45/10 |
| 10,635,143 B2* | 4/2020 | Kim | H01Q 1/243 |
| 2010/0138780 A1* | 6/2010 | Marano | G06F 3/147 |
| | | | 715/804 |
| 2012/0038678 A1* | 2/2012 | Hwang | G06F 3/1454 |
| | | | 345/667 |
| 2013/0016064 A1* | 1/2013 | Lee | G06F 3/0416 |
| | | | 345/174 |
| 2013/0234959 A1* | 9/2013 | Yoo | G06F 3/0488 |
| | | | 345/173 |
| 2013/0234984 A1* | 9/2013 | Yoo | G06F 3/0416 |
| | | | 345/174 |
| 2014/0256375 A1* | 9/2014 | Park | G01R 29/0857 |
| | | | 455/550.1 |
| 2016/0259432 A1* | 9/2016 | Bau | G06F 3/046 |
| 2016/0261268 A1* | 9/2016 | Rakova | G06N 7/005 |
| 2019/0026059 A1* | 1/2019 | Yoo | G06F 3/038 |
| 2020/0081484 A1* | 3/2020 | Lee | H04B 1/06 |

FOREIGN PATENT DOCUMENTS

| | | |
|---|---|---|
| KR | 10-2016-0000330 A | 1/2016 |
| KR | 10-2018-0031424 A | 3/2018 |

\* cited by examiner

METHOD FOR MEASURING ELECTROMAGNETIC SIGNAL RADIATED FROM DEVICE AND ELECTRONIC DEVICE THEREOF

CROSS-REFERENCE TO RELATED APPLICATION(S)

This application is based on and claims priority under 35 U.S.C. § 119(a) of a Korean patent application number 10-2018-0139747, filed on Nov. 14, 2018, in the Korean Intellectual Property Office, the disclosure of which is incorporated by reference herein in its entirety.

BACKGROUND

1. Field

The disclosure relates to a method for measuring an electromagnetic (EM) signal radiated from an external electronic device and an electronic device thereof.

2. Description of Related Art

As electronic devices such as portable phones are advanced, the electronic devices are providing various additional functions. For example, even a service of controlling an external electronic device (e.g., a television (TV)) by using a communication function of the electronic device is being developed. If it is intended to control the external electronic device, the existence and kind of the external electronic device has to be confirmed. By detecting a signal including identification information of the external electronic device, the existence and kind of the external electronic device can be confirmed.

The above information is presented as background information only to assist with an understanding of the disclosure. No determination has been made, and no assertion is made, as to whether any of the above might be applicable as prior art with regard to the disclosure.

SUMMARY

To confirm the existence and kind of an external electronic device, a signal including identification information can be used. But, receiving the signal including the identification information requires an operation in which the external electronic device generates and transmits the signal. Further, the operation in which the external electronic device generates and transmits the signal requires a request of the electronic device, and this can require a user to execute a specific application. That is, a user can execute the application and instruct to transmit a request signal. In response to this, the electronic device can transmit the request signal to the external electronic device, and receive a response signal including identification information from the external electronic device. To identify the external electronic device without this series of procedures, a technology of using a unique electromagnetic interference (EMI) or electromagnetic (EM) signal generated from the device can be used.

Aspects of the disclosure are to address at least the above-mentioned problems and/or disadvantages and to provide at least the advantages described below. Accordingly, an aspect of the disclosure is to provide a method for measuring an EM signal radiated from an external electronic device and an electronic device thereof.

Additional aspects will be set forth in part in the description which follows and, in part, will be apparent from the description, or may be learned by practice of the presented embodiments.

In accordance with an aspect of the disclosure, an electronic device is provided. The electronic device includes a housing configured to include a first surface facing in a first direction, a second surface facing in a second direction opposite to the first direction, and a side member surrounding at least part of a space between the first surface and the second surface, a display configured to be shown through at least a part of the first surface, a first conducting unit configured to be arranged in the housing or the space, a second conducting unit configured to be arranged at a distance from the first conducting unit, in the housing or the space, at least one EM sensing circuit configured to be arranged in the housing, to be electrically or operatively connected with the first conducting unit and the second conducting unit, and to sense an EM signal, and at least one wireless communication circuit, a processor configured to be arranged in the housing, and be operatively connected with the display, the EM sensing circuit and the wireless communication circuit, and a memory configured to be operatively connected with the processor. The memory may store instructions of when being executed, enabling the processor to receive, by using the first conducting unit, a first signal sensed by the EM sensing circuit, and receive, by using the second conducting unit, a second signal sensed by the EM sensing circuit, and determine a signal pattern on the basis of the first signal and the second signal, and identify an external electronic device, at least partially on the basis of the signal pattern.

In accordance with another aspect of the disclosure, an electronic device is provided. The electronic device includes a first conducting unit configured to acquire a first signal which includes an EM signal radiated from an external electronic device and a noise, a second conducting unit configured to acquire a second signal which includes at least part of the noise, and an EM sensing circuit configured to be electrically or operatively connected with the first conducting unit and the second conducting unit, and to measure the EM signal by subtracting the second signal from the first signal.

In accordance with another aspect of the disclosure, an operation method of an electronic device is provided. The operation method includes acquiring a first signal which includes an EM signal radiated from an external electronic device and a noise, by using a first conducting unit, and acquiring a second signal which includes at least part of the noise, by using a second conducting unit, and measuring the EM signal by subtracting the second signal from the first signal.

A method of various embodiments and an electronic device thereof can enable exact EM signal measurement, by subtracting a signal (e.g., a noise) other than an EM signal generated in an external electronic device, from a signal including the noise and the EM signal generated in the external electronic device that is a measurement target.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
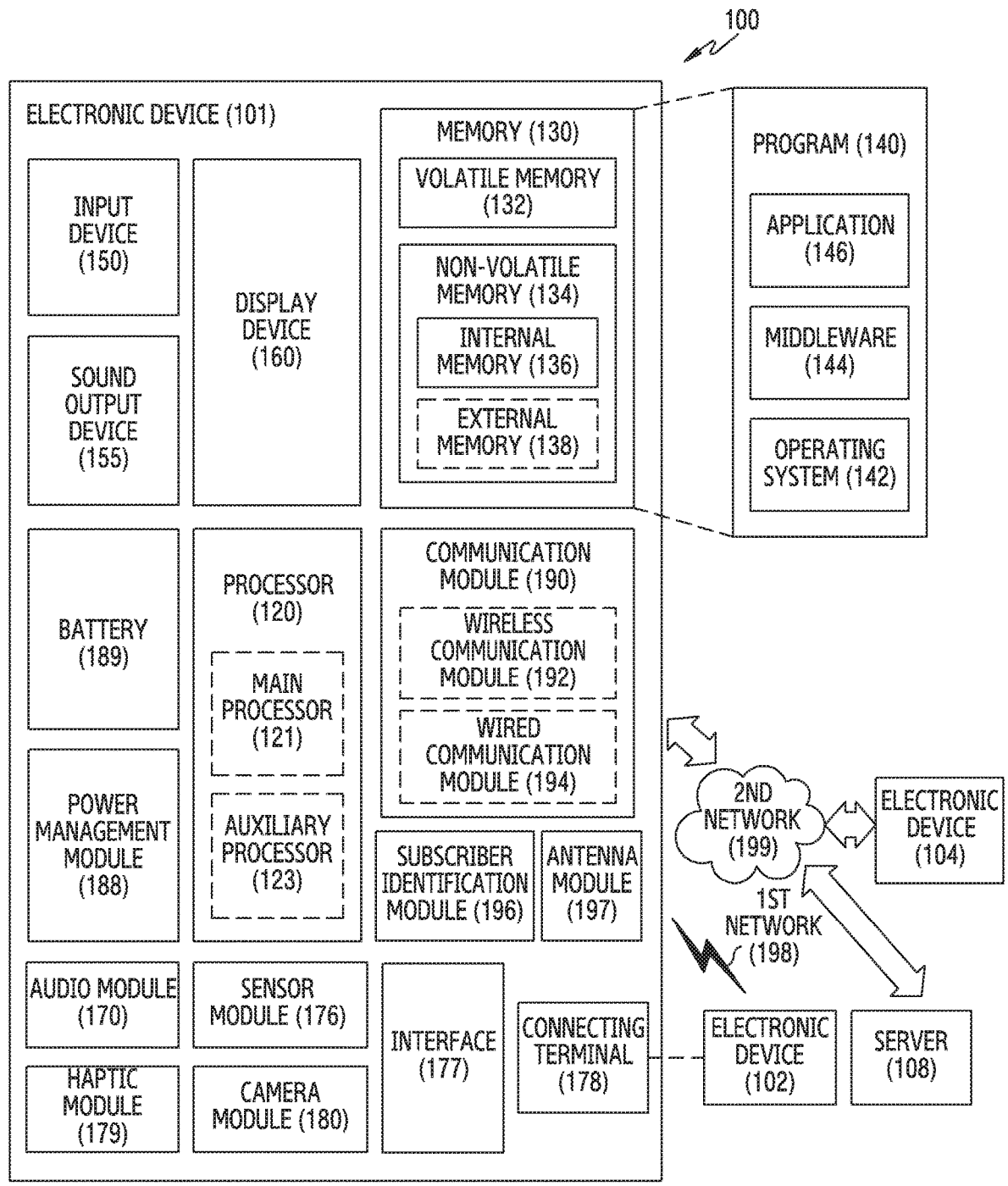
FIG. 1 is a block diagram of an electronic device within a network environment according to an embodiment of the disclosure.

FIG. 1 is a block diagram illustrating an electronic device within a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., printed circuit board (PCB)). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Various embodiments of the disclosure are to measure a unique electromagnetic interference (EMI) or electromagnetic (EM) signal of an external electronic device, and relate to a method for canceling a noise from a signal which includes an EM signal and the noise, and a hardware construction thereof. That is, various embodiments described later are related with EMI/EM measurement, noise canceling, machine learning, big data, classification, distinction, and/or identifying.

An external electronic device (e.g., a television (TV), a refrigerator or a speaker) including electronic circuitry may radiate an EM signal of a unique pattern. Accordingly, research is being made on various technologies for measuring an EM signal radiated from an external electronic device and utilizing the measured EM signal. To measure the EM signal, equipment for receiving and analyzing the signal may be needed. In the disclosure, the equipment for receiving and analyzing the signal is called an 'EM sensor', an 'EM measuring unit', or an 'EM measuring system' below. In response to the EM signal being measured using the EM sensor, the signal is received outside a measurement target device. So, as in FIG. 2 below, a peripheral noise (called an "ambient noise' below) other than the targeted EM signal is introduced and also a noise (called a 'self noise' below) provided from the EM sensor or a device with the EM sensor may be obtained together. Here, the self noise may include an EM signal provided from the EM sensor or the device with the EM sensor.

Figure 2:
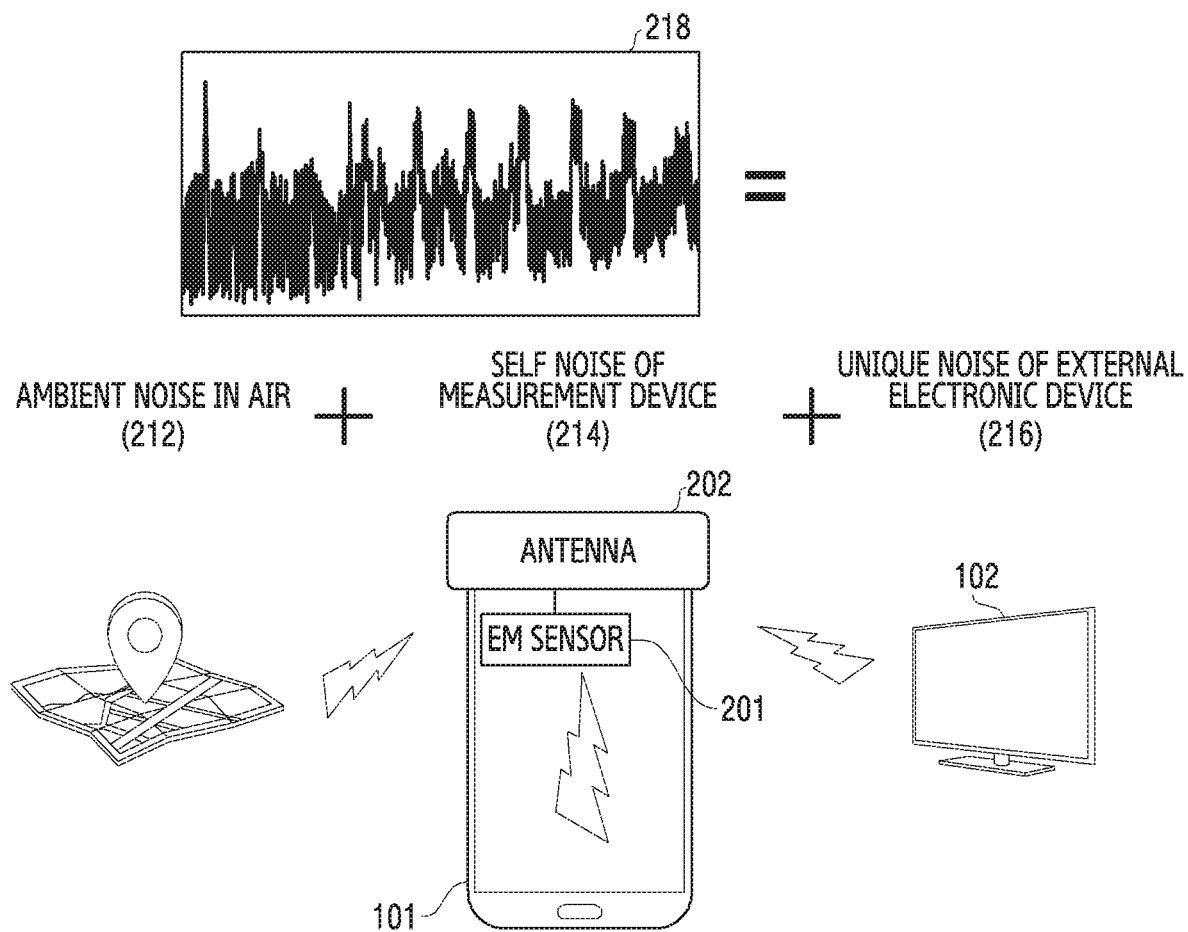
FIG. 2 is a diagram illustrating components of a signal obtained by an electromagnetic (EM) sensor at the time of EM signal measurement according to an embodiment of the disclosure.

FIG. 2 is a diagram illustrating components of a signal obtained by an EM sensor at the time of EM signal measurement according to an embodiment of the disclosure. FIG. 2 exemplifies conditions in which the electronic device 101, including an EM sensor 201 and an antenna 202, measures an EM signal radiated from the electronic device 102 (e.g., TV) that is an external electronic device.

Referring to FIG. 2, an EM signal of an external electronic device (e.g., the electronic device 102) (e.g., TV) may be measured using the electronic device 101. Even though it is intended to measure only a unique EM signal of the electronic device 102, a collected signal 218 may include various signals which are introduced into the antenna 202 installed in the electronic device 101. The collected signal 218 may include various noise signals such as white or ambient noise 212 in the surrounding air, a self noise 214 introduced into the antenna 202 from electronic parts installed in the electronic device 101, and/or a unique noise 216 of the external electronic device (e.g., the electronic device 102) consistent with a measurement target. Here, the unique noise 216 may be an EM signal intended to be measured.

The ambient noise 212 around the electronic device 101 may be different according to a measurement environment and a measurement time point. Accordingly, even though an EM signal of the external electronic device (e.g., the electronic device 102) is measured, a result of the measured signal may be different according to when or where the measurement has been made. That is, owing to the ambient noise 212, a uniqueness of the measured signal may not be guaranteed. Owing to this, even though a corresponding signal is utilized in various applied fields (e.g., machine learning, classification, or database (DB) building), a reliability and accuracy (e.g., a recognition rate of machine learning) of the utilization result can be deteriorated due to an environment deviation, a device deviation, and/or a time point deviation.

Also, the self noise 214 of the electronic device 101 may be different according to an internal hardware design structure (e.g., a mounted part, a printed circuit board (PCB), and/or an antenna (e.g., the antenna 197)). Accordingly, even though the same EM sensor 201 is used, in response to a hardware construction of a device carrying out measurement being different, a result of a measured signal may also be different. For example, even though a model A is used to measure an EM signal of an external electronic device and build a database (DB), a model B having a hardware design different from that of the model A provides a different self noise, so the DB collected using the model A may not be used for the model B.

Owing to problems caused by the aforementioned noises, there is a need for a technology for canceling the ambient noise 212 and the self noise 214 to isolate only the EM signal 216 of the measurement target (e.g., the electronic device 102). The technology for canceling the noise may be a scheme of after separately measuring and storing a specific noise, canceling the corresponding noise from a signal of a measurement target through post processing. However, the ambient noise 212 is different according to a position and time point and therefore, cannot be specified and stored, so the aforementioned scheme may be used for only a use of canceling the self noise 214. Even though the self noise 214 is canceled, in response to the self noise 214 being varied in phase and frequency according to a time point, a previously stored signal may be meaningless data. For example, periods of work executed as a background in a smart phone may be different from one another (e.g., a sensor hub 1 hertz (HZ), a display 60 Hz), so an EM signal entirely different according to a measurement time point may be collected in response to the measurement of an EM signal even during a short time (e.g., 0.5 ms).

Various embodiments of the disclosure described below are to, at the time of measuring an EM signal of an external electronic device, cancel an ambient noise and a self noise in real time, and collect only a unique EM signal of a measurement target. In accordance with various embodiments of the disclosure, by collecting only the unique EM signal of the measurement target, problems (e.g., a deterioration of a recognition rate in machine learning) caused by an environment deviation, a device deviation, and/or a time point deviation may be addressed. In accordance with various embodiments of the disclosure, a problem of failing to use an existing built DB due to the alteration of a self noise resulting from the alteration of a hardware structure may also be addressed.

Figure 3A:
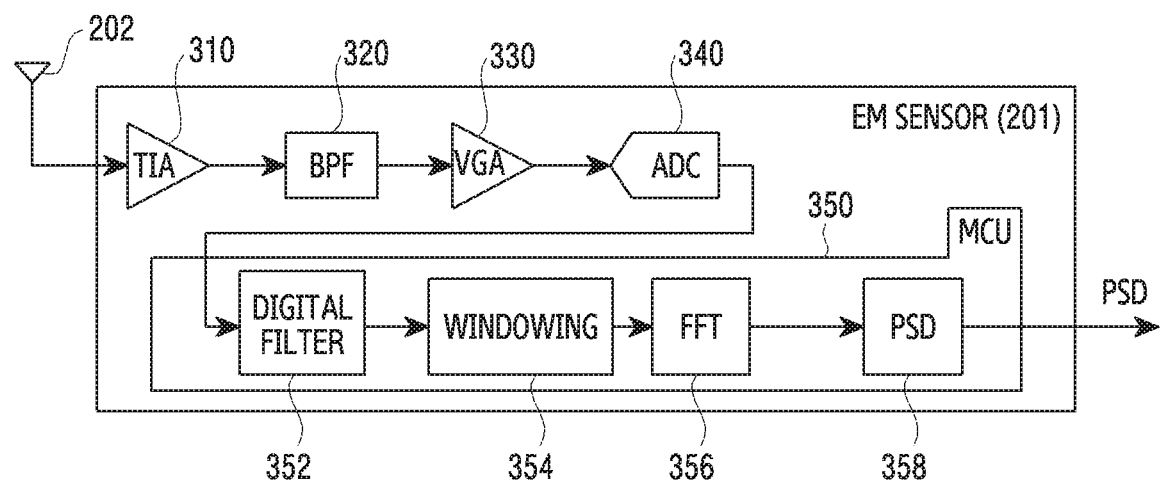
FIG. 3A is a block diagram of an EM sensor according to an embodiment of the disclosure.

FIG. 3A is a block diagram of the EM sensor according to an embodiment of the disclosure.

Figure 3B:
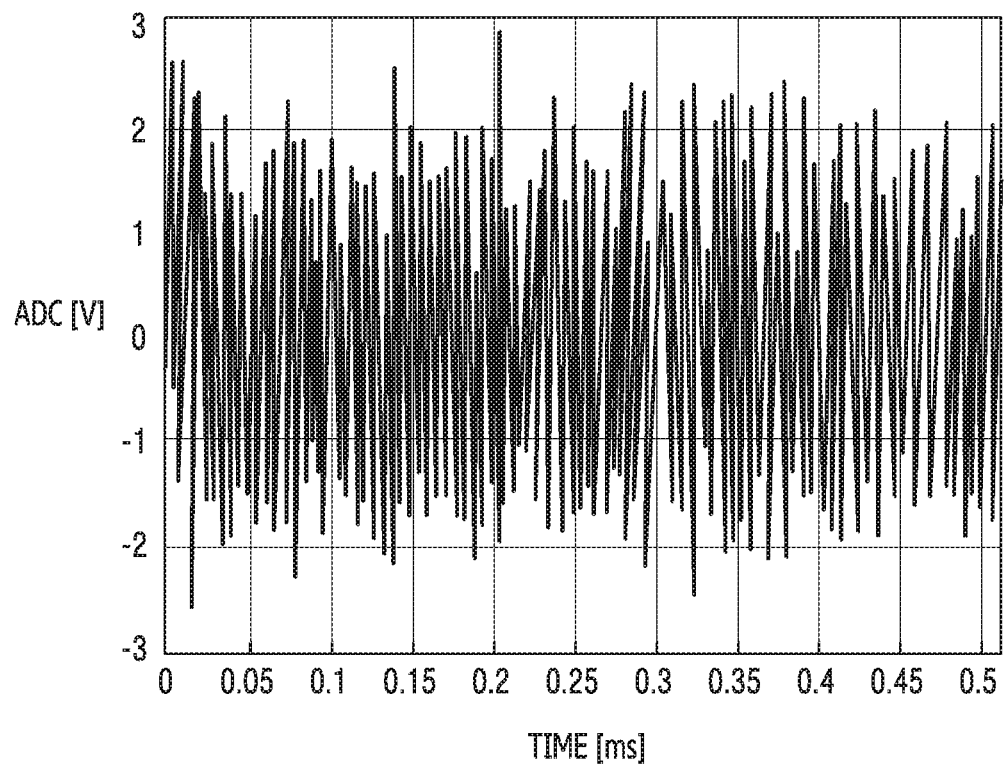
FIG. 3B is a time domain expression of an EM signal according to an embodiment of the disclosure.

FIG. 3B is a time domain expression of an EM signal according to an embodiment of the disclosure.

Figure 3C:
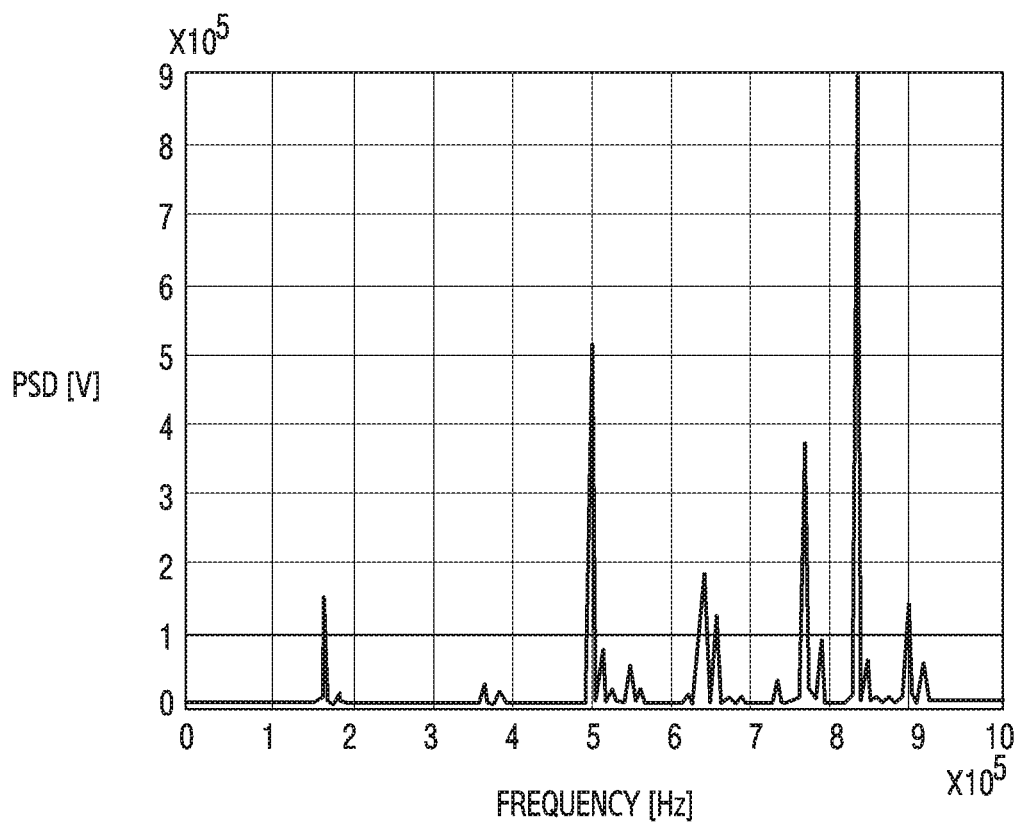
FIG. 3C is a frequency domain expression of an EM signal according to an embodiment of the disclosure.

FIG. 3C is a frequency domain expression of an EM signal according to an embodiment of the disclosure.

Referring to FIG. 3A, the EM sensor 201 may include a transimpedance amplifier (TIA) 310, a band pass filter (BPF) 320, a variable gain amplifier (VGA) 330, an analog digital converter (ADC) 340, and/or a micro controller unit (MCU) 350.

The TIA 310 may have a reception band width capable of processing a signal received through the antenna 202. The TIA 310 may amplify a frequency signal between a few kilo hertz (KHz) to a few mega hertz (MHz), received from the antenna 202. The BPF 320 may filter the signal amplified by the TIA 310 into a specific concerned target signal defining a characteristic pattern. To improve a noise characteristic and external interference signal cancellation characteristic of the filtered signal, the VGA 330 may output a signal at a constant level over a preset gain range. The ADC 340 may convert an analog signal gain controlled by the VGA 330 into a digital signal and provide the digital signal to the MCU 350. The above-described TIA 310, BPF 320, VGA 330 and/or ADC 340 are arranged for the purpose of collecting obtained data on an EM signal of an embodiment of the disclosure, and a sequence and/or construction of respective constituent elements may be altered according to various embodiments.

The MCU 350 may include a digital filter 352, a windowing unit 354, a fast Fourier transform (FFT) unit 356, and/or a power spectrum density (PSD) unit 358. The digital filter 352 may filter out a signal component of an unnecessary band from a digital signal outputted from the ADC 340. To suppress the provision of a frequency component that is distorted by an FFT operation, the windowing unit 354 may decrease a magnitude of a starting portion and an ending portion of a signal. By performing the FFT operation, the FFT unit 356 may transform a time-domain signal (e.g., a signal of FIG. 3B) into a frequency-domain signal (e.g., a signal 330C of FIG. 3C). The PSD unit 358 may obtain a per-frequency PSD value of the frequency-domain signal. Through the aforementioned filtering and signal processing operations, the MCU 350 may acquire obtained data on a refined EM signal from the digital signal provided from the ADC 340. However, in accordance with another embodiment, the MCU 350 may provide the digital signal provided from the ADC 340 to an upper system as well. Also, the time-domain obtained data is simply a signal of a noise component by an EMI, and may need to be transformed into frequency-domain data for the sake of spectrum analysis. However, in accordance with another embodiment, the MCU 350 may provide the time-domain obtained data to the upper system as well.

The FFT operation used when time-domain data is transformed into frequency-domain data may be expressed as in Equation 1.

$$X_k = \sum_{n=0}^{N} x_n \, e^{-j n \pi k \frac{n}{N+1}}$$

In Equation 1, the variable $X_k$ refers to a $k^{th}$ sample of a frequency-domain signal, the variable N refers to the number of samples of a time-domain signal, and the variable $x_n$ refers to the $k^{th}$ sample of the time-domain signal. Through an operation such as Equation 1, time-domain data exemplified in FIG. 3B may be transformed, such as into frequency-domain data exemplified in FIG. 3C.

The time-domain obtained data may be denoted as 'ADC data', and the frequency-domain obtained data may be denoted as 'PSD data'. For example, the ADC data may be expressed as in FIG. 3B, and the PSD data may be expressed as in FIG. 3C. The EM sensor 201 may provide the ADC data and/or the PSD data as output data.

A sequence and/or construction of a filter of an object for transforming a form of obtained data and/or a signal processing algorithm and/or a region transforming algorithm such as FFT which are carried out in the MCU 350 may be altered. A series of processes or a few processes processed in the MCU 350 of various embodiments of the disclosure may be performed concurrently or separately in a processor of the MCU 350 and/or another processor (e.g., the processor 120), such as a processor of an upper system. A processor of various embodiments of the document is not limited to the aforementioned processors.

The EM sensor 201 described with reference to FIGS. 3A to 3C is not only operable as one independent sensor or module, but also may be implemented as a circuit block included collectively or partially in a specific device (e.g., the electronic device 101). For example, at least part of the EM sensor 201 may be a partial constituent element of the electronic device 101 and, may be part of the processor 120.

Figure 4:
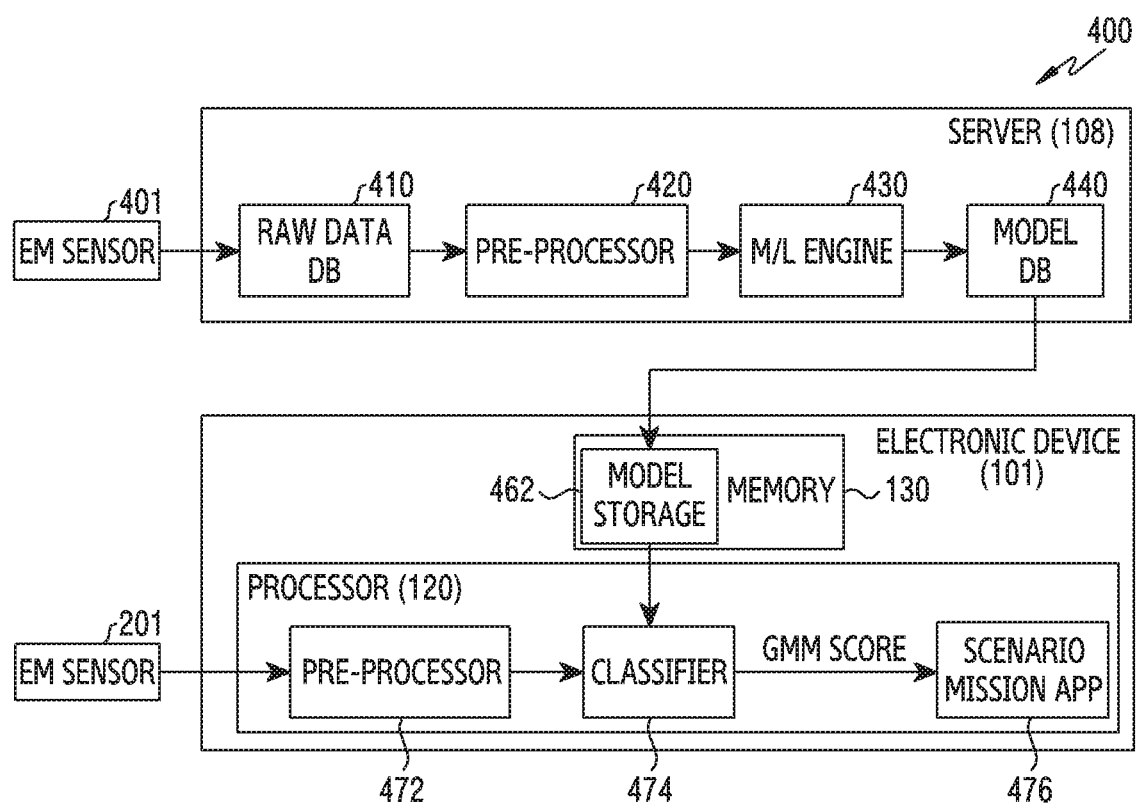
FIG. 4 is a machine learning system for an EM signal according to an embodiment of the disclosure.

FIG. 4 is a machine learning system for an EM signal according to an embodiment of the disclosure. FIG. 4 illustrates, as a machine learning system 400, the server 108 for performing machine learning by using a measured EM signal and the electronic device 101 for using a result of the machine learning.

Referring to FIG. 4, ADC data and/or PSD data outputted from the EM sensor 201 may be used in a machine learning (M/L) engine 430 for providing a learning model, and may be used to classify, distinguish and/or identify a peripheral external electronic device (e.g., the electronic device 102) adjacent to the electronic device 101.

The server 108 may include a raw data database (DB) 410, a pre-processor 420, the M/L engine 430, and/or a model DB 440. The raw data DB 410 may store, as big data, a unique EM signal of a specific external electronic device provided from an EM sensor 401. The EM sensor 401 may be configured identically with the EM sensor 201. The pre-processor 420 may transform obtained data collected by the raw data DB 410 into a format suitable to machine learning. By performing the learning by using the obtained data, the M/L engine 430 may provide a model of an EM signal on a per-device basis. The model DB 440 may store learning model data which includes information about unique signals of external electronic devices provided after the machine learning or preset unique signals of the external electronic devices. For example, the learning model data may include a look-up table which includes items regenerated to correspond to specific values of respective unique signals wherein a corresponding program is accessible within a short time. A series of processes performed in the aforementioned server 108 may be processed concurrently or separately in various devices and/or systems. For example, the series of processes may be processed concurrently or separately in at least one of a local drive, a device internal system and memory, an external system, a cloud, a portable communication device (e.g., a smart phone), a computer device, a portable multimedia device, a portable medical device, a camera, a wearable device, or a home appliance.

The electronic device 101 may include the memory 130 and the processor 120. The memory 130 may include a model storage 462. The processor 120 may include a pre-processor 472, a classifier 474, and a scenario mission application 476. The learning model data stored in the model DB 440 of the server 108 may be forwarded to the electronic device 101 that intends to identify an external electronic device. The learning model data may be downloaded and stored in the model storage 462 of the memory 130 periodically or by a request. The pre-processor 472 may transform obtained data on an EM signal of an external electronic device provided from the EM sensor 201 into a format suitable for classification. The classifier 474 may match a model of a similar waveform through an operation of matching obtained data provided from the pre-processor 472 with corresponding values of respective unique signals included in the learning model data stored in the model storage 462. For example, the classifier 474 may output a score (e.g., a generalized method of moments (GMM) score) table that indicates a degree of similarity between obtained electromagnetic data of an approaching external electronic device and unique signals of several models stored in an internal memory. For example, when a user of the electronic device 101 including the classifier 474 approaches a TV, in response to the learning model data of a TV, a laptop computer, a phone and/or a smart watch having been stored in the internal memory 130 of the electronic device 101, the classifier 474 may output a score table including TV 5.2 points, laptop 1.5 points, phone 0.8 points, and smart watch 0.4 points. Through this, the electronic device 101 may distinguish that the external electronic device is the TV. By performing a corresponding function of utilizing information about the identified external electronic device, the scenario mission application 476 may provide various convenience functions to the user.

In the machine learning system 400 exemplified in FIG. 4, the EM sensor 201 is illustrated as a device separate from the electronic device 101. That is, the EM sensor 201 may be arranged within the electronic device 101. In an embodiment, at least part of the EM sensor 201 may be included in the processor 120.

Figure 5:
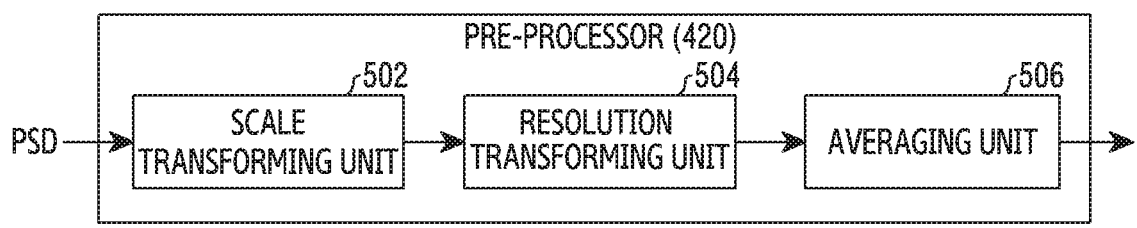
FIG. 5 is a block diagram of a pre-processor according to an embodiment of the disclosure.

FIG. 5 is a block diagram of a pre-processor according to an embodiment of the disclosure.

Referring to FIG. 5, the pre-processor 420 may include a scale transforming unit 502, a resolution transforming unit 504, and/or an averaging unit 506. The scale transforming unit 502 may transform PSD values into a log scale. The resolution transforming unit 504 may decrease the number of samples of the PSD values. For example, the resolution transforming unit 504 may transform an N number of samples into one sample. The one sample may have a maximum value of the N number of samples, a minimum value thereof, or an average value thereof. The averaging unit 506 may standardize the PSD values. For example, to remove an unnecessary noise component, the averaging unit 506 may perform an averaging operation.

Figure 6:
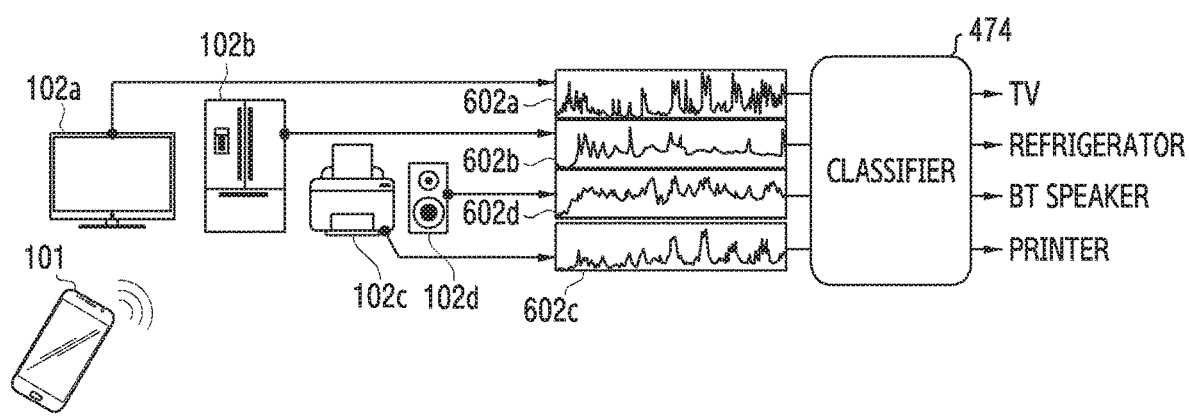
FIG. 6 is a conceptual diagram of an operation of identifying a device by using an EM signal according to an embodiment of the disclosure.

FIG. 6 is a conceptual diagram of an operation of identifying a device by using an EM signal according to an embodiment of the disclosure.

Referring to FIG. 6, a plurality of external electronic devices may be arranged around the electronic device 101. For example, the external electronic devices may include a TV 102a, a refrigerator 102b, a printer 102c, and/or a Bluetooth speaker 102d. According to an embodiment, these external electronic devices may include various parts therein. An EM signal 602a, 602b, 602c or 602d respectively provided from the plurality of external electronic devices may include various frequency signals. For example, the EM signal may include corresponding unique signals of a few KHz to a few MHz. In response to the electronic device 101 approaching any one of the external electronic devices, the electronic device 101 may obtain a unique signal resulting from an electromagnetic interference through the EM sensor 201 and the antenna 202, and, using the classifier 474, identify or classify a corresponding external electronic device by using the obtained signal. According to an embodiment, information about the identified external electronic device may be displayed through a display (e.g., the display device 160) of the electronic device 101. In accordance with another embodiment, the information about the identified external electronic device may be outputted in an auditory manner as well.

The electronic device 101 may include a memory (e.g., the memory 130) for storing model data (e.g., a lookup table) which includes unique signals corresponding to various external electronic devices. But, the disclosure is not limited to this, and the model data may be stored in an external server (e.g., the server 108) capable of communicating with the electronic device 101 through a network as well. The electronic device 101 may perform an operation of comparison with an EM signal of the external electronic device obtained through the communication with the external server. In this case, the electronic device 101 may transmit information about the obtained EM signal to the external server and receive identification information of the matched external electronic device from the external server.

The electronic device 101 may execute a specific application on the basis of the identification information of the external electronic device. For example, in response to the external electronic device being identified as a TV, the electronic device 101 may automatically execute an application associated with a remote controller, and establish a connection with the TV. Accordingly to this, the external electronic device may be put in a stand-by controllable state with only a motion of the electronic device 101 approaching the external electronic device, whereby a user convenience may be enhanced.

Figure 7:
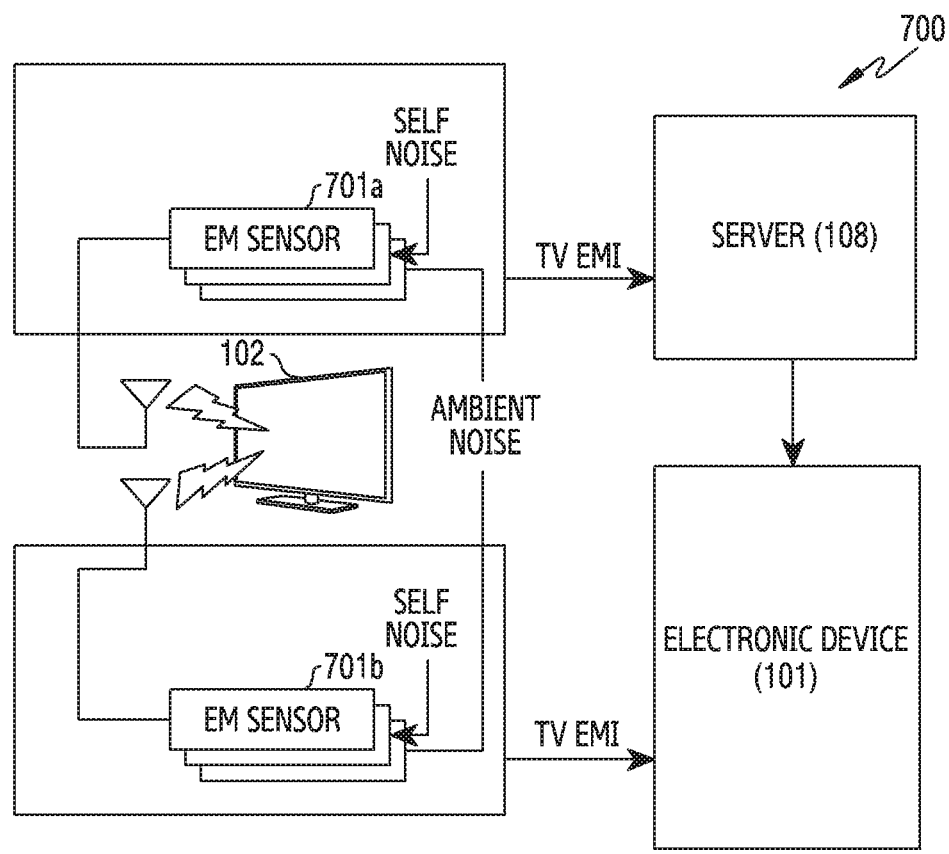
FIG. 7 is a machine learning system for an EM signal supporting a noise cancellation function according to an embodiment of the disclosure.

FIG. 7 is a machine learning system for an EM signal supporting a noise cancellation function according to an embodiment of the disclosure.

Referring to FIG. 7, a machine learning system 700 may include the server 108 and the electronic device 101. At least one EM sensor 701a and at least one EM sensor 701b exemplified in FIG. 7 are sensors of the same kind and may have the same or similar structure with the EM sensor 201 of FIG. 2. The at least one EM sensor 701a and the at least one EM sensor 701b may acquire a signal which includes an EM signal radiated from an external electronic device (e.g., the electronic device 102) and a noise (e.g., an ambient noise and/or a self noise), and simultaneously collect the ambient noise and/or the self noise through a separate path (e.g., a separate antenna). Accordingly, the at least one EM sensor 701a and the at least one EM sensor 701b may subtract the ambient noise and/or the self noise from the acquired signal. Through this process, the ambient noise and/or the self noise may be canceled in real time and only the EM signal of the external electronic device (e.g., the electronic device 102) that is a measurement target may be stored in a database. The server 108 may perform machine learning on the basis of a signal from which a noise measured with the at least one EM sensor 701a is canceled, thereby providing a learning model. By comparing the learning model and a unique EM signal of a specific device measured with the at least one EM sensor 701b, the electronic device 101 may classify whether the EM signal is a signal of a certain device.

In the machine learning system 700 exemplified in FIG. 7, the EM sensor 701b is illustrated as a device separate from the electronic device 101. However, the EM sensor 701b may be arranged within the electronic device 101. In an embodiment, at least part of the EM sensor 701b may be included in the processor 120.

Figure 8A:
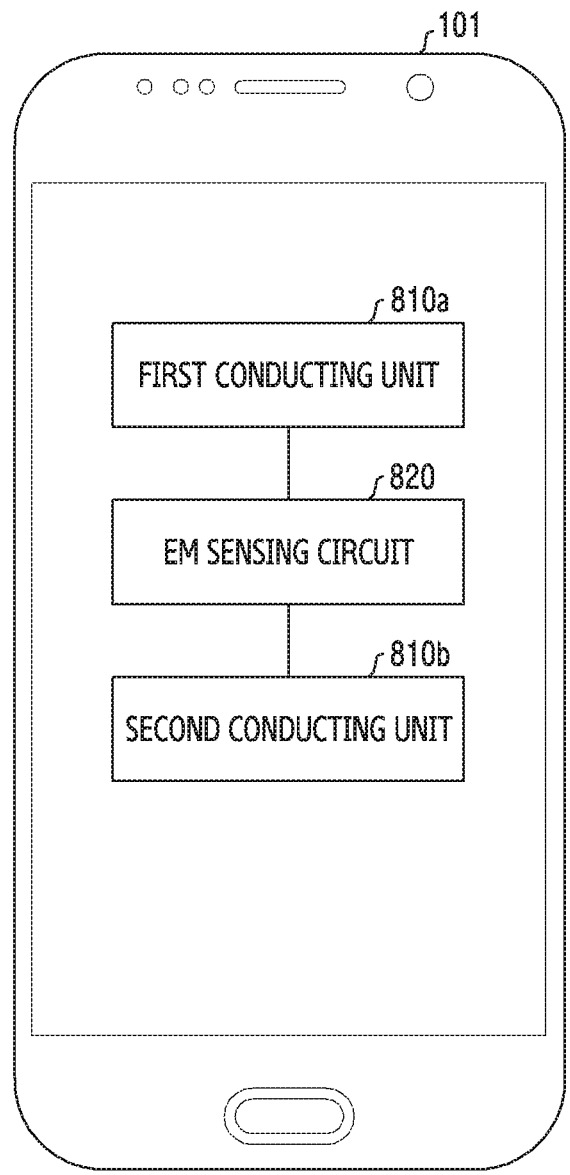
FIG. 8A is an arrangement diagram of constituent elements for measuring an EM signal in an electronic device according to an embodiment of the disclosure.

FIG. 8A is an arrangement diagram of constituent elements for measuring an EM signal in an electronic device according to an embodiment of the disclosure.

Referring to FIG. 8A, the electronic device 101 may include a first conducting unit 810a, a second conducting unit 810b, and/or an EM sensing circuit 820.

The first conducting unit 810a may be a structure for receiving a signal which includes an EM signal radiated from an external electronic device (e.g., the TV 102a, the refrigerator 102b, and/or the Bluetooth speaker 102d) and a noise (e.g., an ambient noise and/or a self noise). For example, the first conducting unit 810a may be an antenna. The second conducting unit 810b may be a structure for receiving a noise (e.g., ambient noise and/or self noise) signal. For example, the second conducting unit 810b may be an antenna or a ground circuit.

By using a first signal acquired using the first conducting unit 810a and a second signal acquired using the second conducting unit 810b, the EM sensing circuit 820 may measure an EM signal radiated from an external electronic device. The EM sensing circuit 820 may include at least one EM sensor 201. The EM sensing circuit 820 may be part of at least one processor (e.g., the processor 120), or include the at least one processor. The EM sensing circuit 820 may provide a signal pattern on the basis of the first signal and the second signal and identify an external electronic device at least partly on the basis of the signal pattern. In accordance with an embodiment, the EM sensing circuit 820 may provide the signal pattern by subtracting the second signal from the first signal. Various implementation examples of the EM sensing circuit 820 are described below with reference to FIGS. 8B to 8D.

Figure 8B:
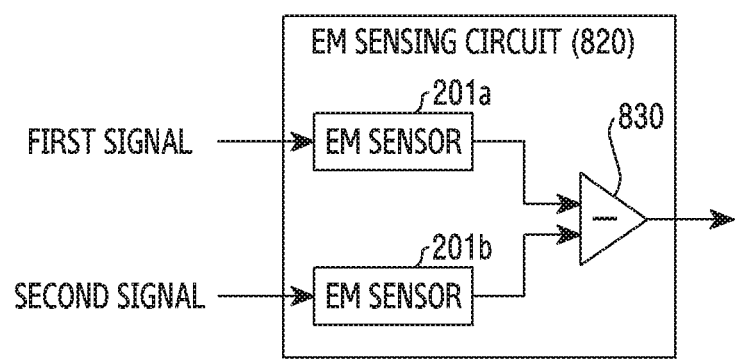
FIGS. 8B, 8C, and 8D are various implementation examples of an EM sensing circuit according to various embodiments of the disclosure.
Figure 8C:
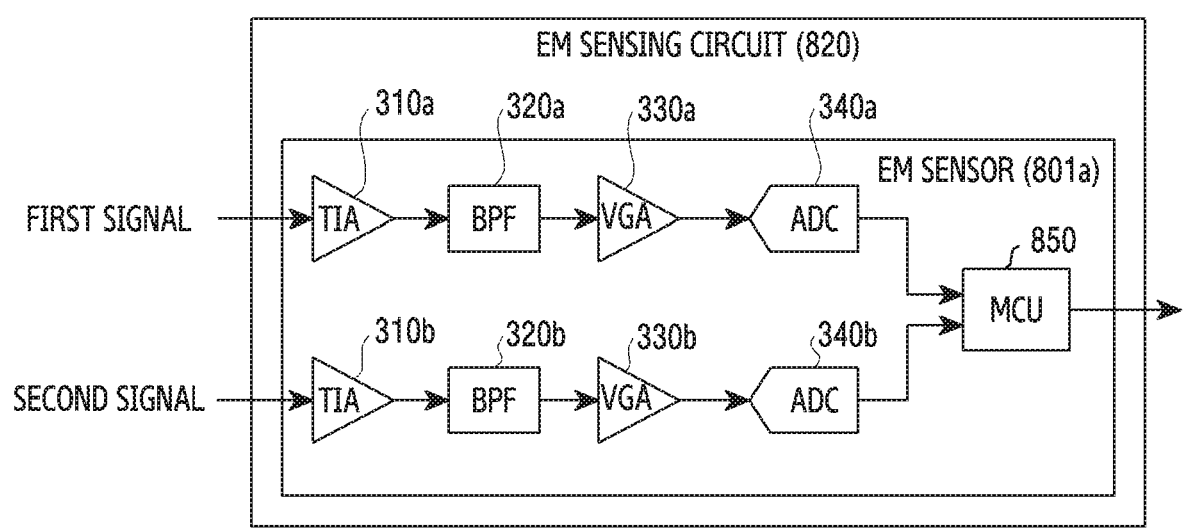
Figure 8D:
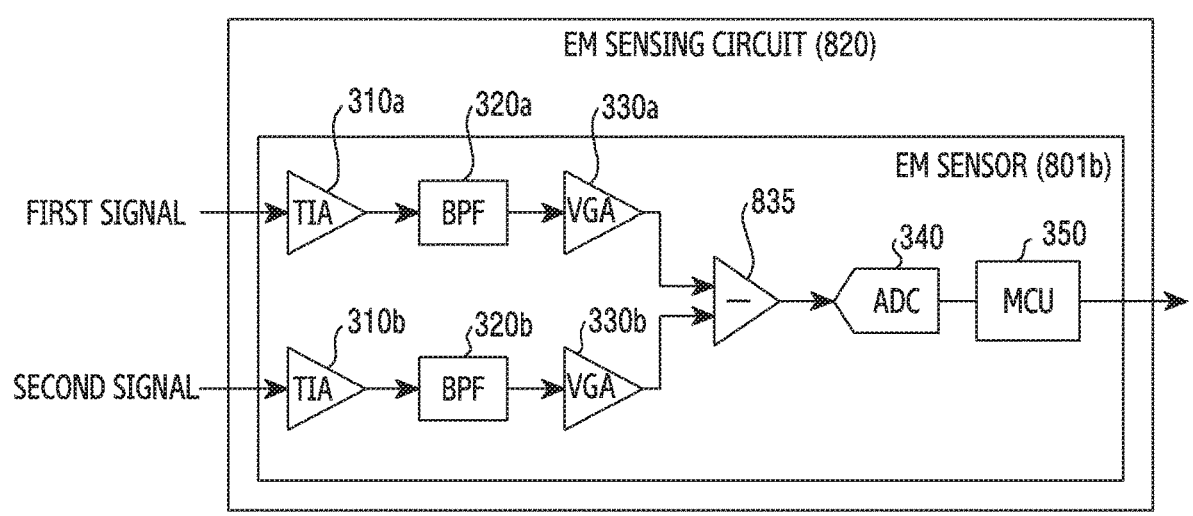

FIGS. 8B, 8C, and 8D are various implementation examples of an EM sensing circuit according to various embodiments of the disclosure.

Referring to FIG. 8B, a subtraction operation between a first signal and a second signal is performed outside EM sensors. As illustrated in FIG. 8B, an EM sensing circuit 820 may include a first EM sensor 201a for measuring the first signal and a second EM sensor 201b for measuring the second signal, and further include an operation unit 830 for performing the subtraction operation between the first signal and the second signal. The first EM sensor 201a and the second EM sensor 201b each may have one channel and have a structure similar with that of the EM sensor 201 described with reference to FIGS. 3A to 3C.

Referring to FIG. 8C, a subtraction operation between a first signal and a second signal is performed in an EM sensor 801a of a 2-channel structure. As illustrated in FIG. 8C, an EM sensing circuit 820 may include the EM sensor 801a of the 2-channel structure. The EM sensor 801a may include a first channel and a second channel and include an MCU 850 for processing a first digital signal provided through the first channel and a second digital signal provided through the second channel. The first channel may include a first TIA 310a, a first BPF 320a, a first VGA 330a, and a first ADC 340a, and the second channel may include a second TIA 310b, a second BPF 320b, a second VGA 330b, and a second ADC 340b. The first TIA 310a and the second TIA 310b may perform the same function as the TIA 310 described with reference to FIG. 3A. The first BPF 320a and the second BPF 320b may perform the same function as the BPF 320 described with reference to FIG. 3A. The first VGA 330a and the second VGA 330b may perform the same function as the VGA 330 described with reference to FIG. 3A. The first ADC 340a and the second ADC 340b may perform the same function as the ADC 340 described with reference to FIG. 3A. The MCU 850 may perform a subtraction operation between the first digital signal and the second digital signal.

Referring to FIG. 8D, a subtraction operation between a first signal and a second signal is performed in an EM sensor 801b of a 2-channel structure. In the example of FIG. 8D, unlike the example of FIG. 8C, the subtraction operation may be performed using analog signals. Referring to FIG. 8D, an EM sensing circuit 820 may include the EM sensor 801b of the 2-channel structure. The EM sensor 801b may include a first channel, a second channel, an operation unit 835, the ADC 340, and the MCU 350. The first channel may include a first TIA 310a, a first BPF 320a, and a first VGA 330a. The second channel may include a second TIA 310b, a second BPF 320b, and a second VGA 330b. The operation unit 835 may perform a subtraction operation between a first analog signal provided through the first channel and a second analog signal provided through the second channel. That is, according to the example of FIG. 8D, the subtraction operation may, instead of being performed at a frequency domain going through FFT operation, be performed using a comparator (e.g., the operation unit 835) at an analog end before digital conversion.

According to various embodiments of the disclosure, an electronic device (e.g., the electronic device 101) may include a housing configured to include a first surface facing in a first direction, a second surface facing in a second direction opposite to the first direction, and a side member surrounding at least part of a space between the first surface and the second surface, a display (e.g., the display device 160) configured to be shown through at least a part of the first surface, a first conducting unit (e.g., the first conducting unit 810a) configured to be arranged in the housing or the space, a second conducting unit (e.g., the second conducting unit 810b) configured to be arranged at a distance from the first conducting unit (e.g., the first conducting unit 810a), in the housing or the space, at least one EM sensing circuit (e.g., the EM sensing circuit 820) configured to be arranged in the housing, to be electrically or operatively connected with the first conducting unit (e.g., the first conducting unit 810a) and the second conducting unit (e.g., the second conducting unit 810b), and to sense an EM signal, and at least one wireless communication circuit (e.g., the communication module 190), a processor (e.g., the processor 120) configured to be arranged in the housing, and be operatively connected with the display, the EM sensing circuit, and the wireless communication circuit, and a memory (e.g., the memory 130) configured to be operatively connected with the processor. The memory may store instructions that, when executed, enable the processor to receive, by using the first conducting unit (e.g., the first conducting unit 810a), a first signal sensed by the EM sensing circuit, and receive, by using the second conducting unit (e.g., the second conducting unit 810b), a second signal sensed by the EM sensing circuit, and determine a signal pattern on the basis of the first signal and the second signal, and identify an external electronic device (e.g., the electronic device 102), at least partially on the basis of the signal pattern.

According to various embodiments of the disclosure, the first conducting unit (e.g., the first conducting unit 810a) may be included in the side member.

According to various embodiments of the disclosure, the second conducting unit (e.g., the second conducting unit 810b) may be included in the side member.

According to various embodiments of the disclosure, the second conducting unit (e.g., the second conducting unit 810b) may be electrically connected with a ground member arranged in the housing.

According to various embodiments of the disclosure, the first signal may include an EM signal provided from the external electronic device (e.g., the electronic device 102), and may further include at least one of an EM signal provided from the electronic device (e.g., the electronic device 101) or an external ambient noise.

According to various embodiments of the disclosure, the second signal may include at least one of an EM signal provided from the electronic device (e.g., the electronic device 101) or an external ambient noise.

According to various embodiments of the disclosure, the instructions may enable the processor (e.g., the processor 120) to determine the signal pattern by offsetting the second signal from the first signal.

According to various embodiments of the disclosure, the instructions may enable the processor to determine whether to use the second signal on the basis of a similarity between the first signal and the second signal, and in response to not using the second signal, determine the signal pattern by using the first signal and a specified noise signal.

According to various embodiments of the disclosure, the instructions may enable the processor to determine a weight applied to the second signal, on the basis of an angle or distance between the external electronic device (e.g., the electronic device 102) and the electronic device, and determine the signal pattern by offsetting the second signal applying the weight from the first signal.

According to various embodiments of the disclosure, the weight may be provided relative to the angle or distance (e.g., a small weight as the angle or distance is small).

According to various embodiments of the disclosure, an electronic device (e.g., the electronic device 101) may include a first conducting unit (e.g., the first conducting unit 810a) configured to acquire a first signal which includes an electromagnetic (EM) signal radiated from an external electronic device (e.g., the electronic device 102) and a noise, a second conducting unit (e.g., the second conducting unit 810b) configured to acquire a second signal which includes at least part of the noise, and an EM sensing circuit (e.g., the EM sensing circuit 820) configured to be electrically or operatively connected with the first conducting unit and the second conducting unit, and to measure the EM signal by subtracting the second signal from the first signal.

According to various embodiments of the disclosure, the first conducting unit (e.g., the first conducting unit 810a) may include a first antenna (e.g., the upper antenna 1010a) installed in an upper end of the electronic device, and the second conducting unit (e.g., the second conducting unit 810b) may include a second antenna (e.g., the lower antenna 1010b) installed in a lower end of the electronic device.

According to various embodiments of the disclosure, the first conducting unit (e.g., the first conducting unit 810a) may include an antenna (e.g., the antenna 1410) installed in an upper end of the electronic device, and the second conducting unit (e.g., the second conducting unit 810b) may include a ground circuit (e.g., the ground circuit 1432) connected to the ground of an internal circuit substrate of the electronic device.

According to various embodiments of the disclosure, the EM sensing circuit (e.g., the EM sensing circuit 820) may include a first sensor (e.g., the first EM sensor 201a) of a 1-channel structure for processing the first signal, a second sensor (e.g., the second EM sensor 201b) of a 1-channel structure for processing the second signal, and an operation unit (e.g., the operation unit 830) for performing a subtraction operation between the first signal and the second signal.

According to various embodiments of the disclosure, the EM sensing circuit (e.g., the EM sensing circuit 820) may include a sensor (e.g., the EM sensor 801a or the EM sensor 801b) of a 2-channel structure for processing the first signal and the second signal, and performing a subtraction operation between the first signal and the second signal.

Figure 9:
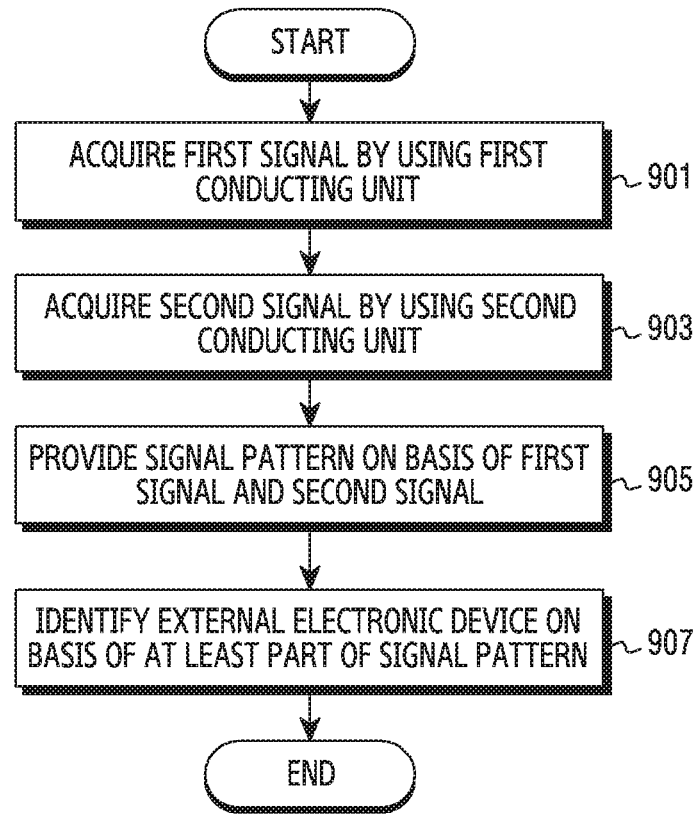
FIG. 9 is a flowchart for identifying an external electronic device by using a measurement result of an EM signal in an electronic device according to an embodiment of the disclosure.

FIG. 9 is a flowchart for identifying an external electronic device by using a measurement result of an EM signal in an electronic device according to an embodiment of the disclosure. An operation illustrated in the flowchart of FIG. 9 may be understood as performed by the electronic device 101 or a constituent element (e.g., the processor 120 or the EM sensing circuit 820) of the electronic device 101.

Referring to FIG. 9, the electronic device 101 (e.g., the processor 120) may acquire a first signal by using the first conducting unit 810a in operation 901. The first signal may include an EM signal radiated from the external electronic device (e.g., the electronic device 102) that is a measurement target, and a noise. Here, the noise may include an ambient noise provided around the electronic device 101 and/or a self noise provided within the electronic device 101.

In operation 903, the electronic device 101 may acquire a second signal by using the second conducting unit 810b. The second signal, a noise, may include at least part of an ambient noise provided around the electronic device 101 and/or at least part of a self noise provided within the electronic device 101.

In operation 905, the electronic device 101 may provide a signal pattern on the basis of the first signal and the second signal. In accordance with an embodiment, the electronic device 101 may provide the signal pattern by subtracting the second signal from the first signal. The subtraction operation may be performed using an analog signal or using a digital signal. The signal pattern may indicate the EM signal of the external electronic device.

In operation 907, the electronic device 101 may identify the external electronic device on the basis of at least part of the signal pattern. In accordance with an embodiment, the electronic device 101 may identify the external electronic device by using learning model data. For example, the electronic device 101 may compare the signal pattern with various signals included in the learning model data and, on the basis of the comparison result, determine whether the signal pattern is most similar with a signal of a device of which kind.

Figure 10A:
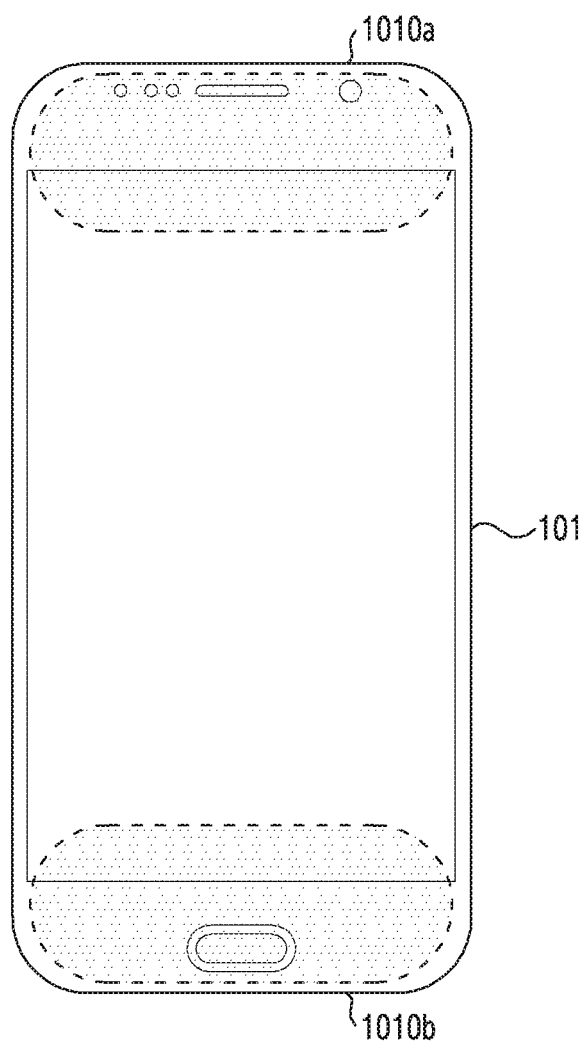
FIG. 10A is an example of conducting units implemented with an antenna in an electronic device according to an embodiment of the disclosure.

FIG. 10A is an example of conducting units implemented with an antenna in an electronic device according to an embodiment of the disclosure.

Referring to FIG. 10A, a first conducting unit (e.g., first conducting unit 810a) and a second conducting unit (second conducting unit 810b) of electronic device 101 may be implemented with an upper antenna 1010a and a lower antenna 1010b. According to an embodiment, the upper antenna 1010a among the upper antenna 1010a and the lower antenna 1010b is in touch with an external electronic device (e.g., the electronic device 102) that is a measurement target, whereby the upper antenna 1010*a* may simultaneously receive a unique EM signal of the external electronic device intended to be measured and a self noise and/or ambient noise, and the lower antenna 1010*b* may measure the self noise and/or ambient noise excepting the unique EM signal of the external electronic device. In response to a signal collected through the lower antenna 1010*b* being subtracted from a signal collected through the upper antenna 1010*a*, only the unique EM signal of the external electronic device that is the measurement target may be obtained.

A basis of the subtraction operation using the lower antenna 1010*b* is explained below with reference to FIG. 10B.

Figure 10B:
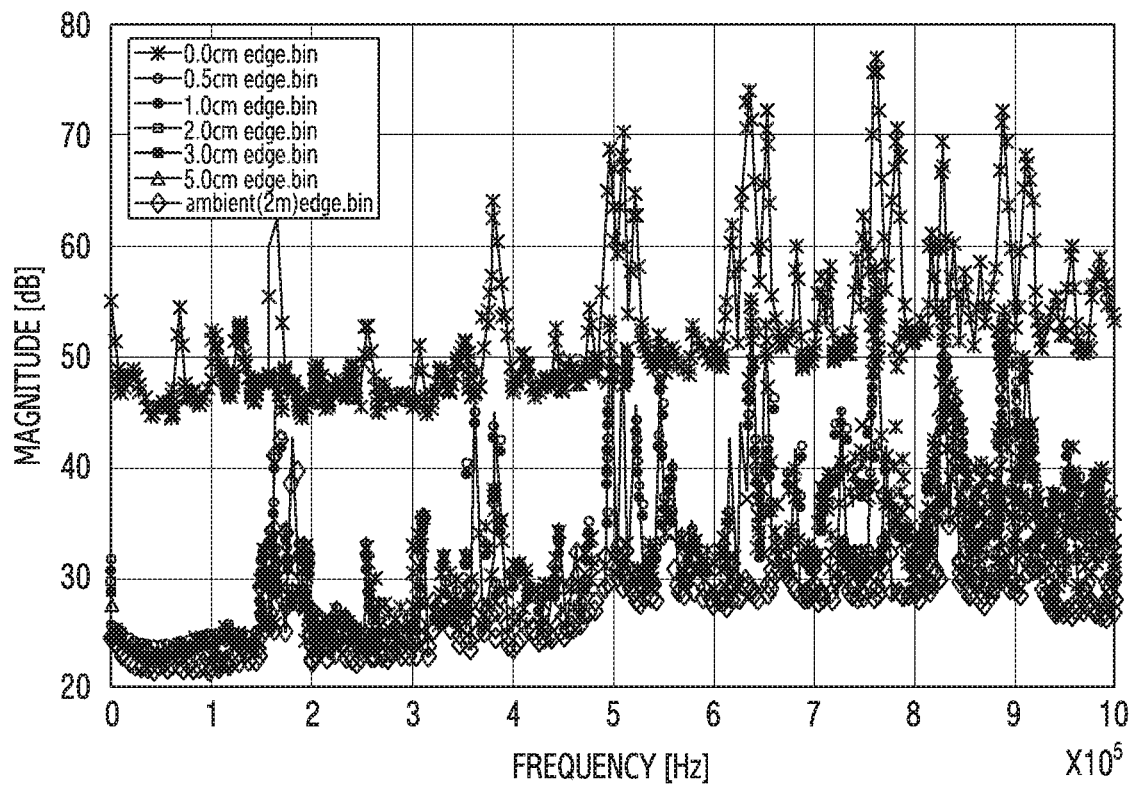
FIG. 10B illustrates obtained signals dependent on a distance between an antenna and a measurement target according to an embodiment of the disclosure.

FIG. 10B illustrates obtained signals dependent on a distance between an antenna and a measurement target according to an embodiment of the disclosure.

Referring to FIG. 10B, the uppermost signal is an EM signal measured in a state in which an antenna gets in touch with an external electronic device that is a measurement target, the lowermost signal is an EM signal measured in a state in which an antenna is a distance of 2 meter (m) away from the external electronic device, and respective signals shown between the uppermost signal and the lowermost signal are EM signals measured in states in which the antenna is a distance of 0.5 centimeters (cm), 1 cm, 2 cm, 3 cm, and 5 cm away. The EM signal measured in the state in which the antenna is a distance of 2 m away may be understood as including only an ambient noise and/or self noise. As confirmed in FIG. 10B, the EM signal measured in the state in which the antenna is a distance of 0.5 cm away is different from the EM signal measured in the state in which the antenna is directly touched, and is similar with an EM signal measured in a state in which the antenna is a distance away (e.g., the state in which the antenna is distant 2 m away). Through this, in response to the antenna being even a small distance away, only the ambient noise and/or self noise excepting the unique EM signal of the external electronic device may be measured.

As described above, in response to using the upper antenna 1010*a* and the lower antenna 1010*b*, the execution or non-execution of a subtraction operation using a signal acquired through the lower antenna 1010*b* may be controlled according to a state of the electronic device 101, for example, a grip state of the electronic device 101 or an angle with respect to the external electronic device. In response to confirming the state of the electronic device 101 by using a sensor (e.g., a gyro sensor and/or an acceleration sensor) installed in the electronic device 101 and providing that an effect of the subtraction operation is not great on the basis of the confirmed state, the electronic device 101 may disable the subtraction operation.

Figure 11:
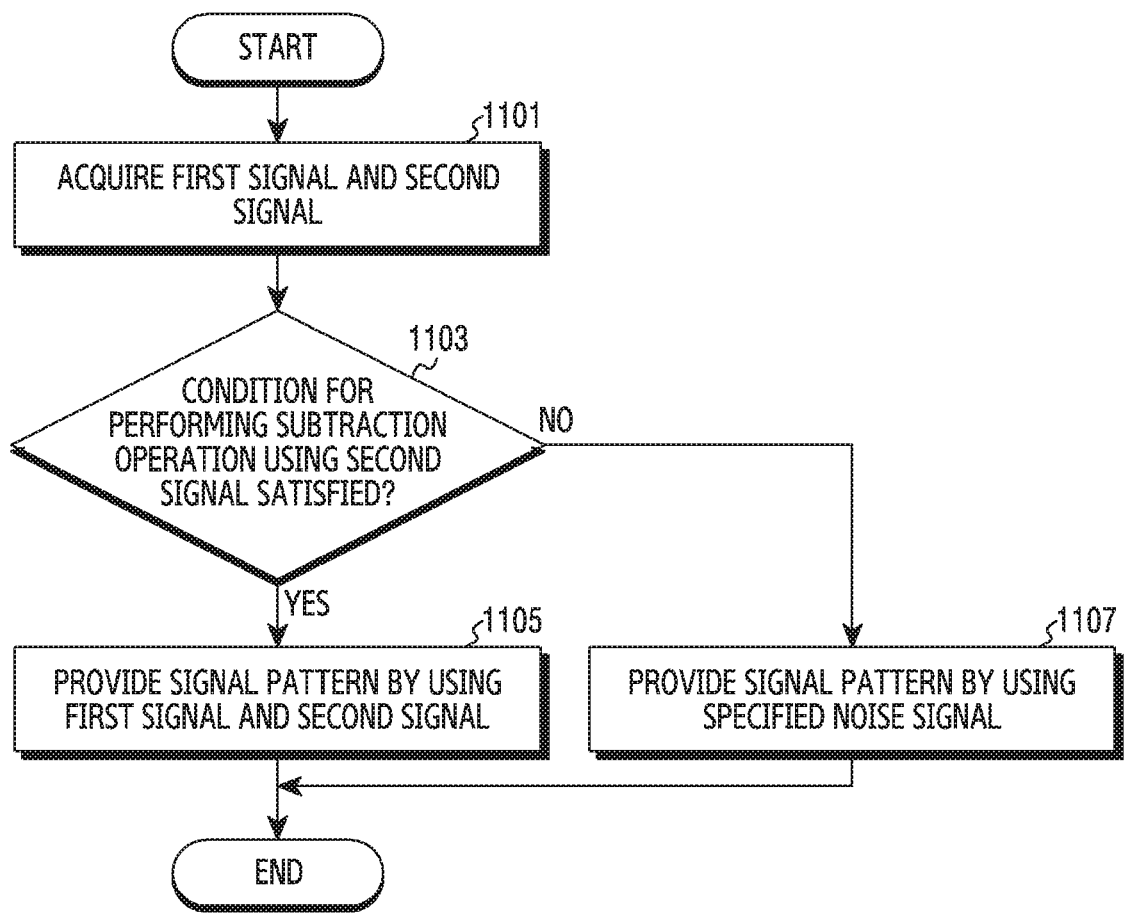
FIG. 11 is a flowchart for adaptively controlling a subtraction operation that uses a measured signal in an electronic device according to an embodiment of the disclosure.

FIG. 11 is a flowchart for adaptively controlling a subtraction operation that uses a measured signal in an electronic device according to an embodiment of the disclosure. An operation illustrated in the flowchart of FIG. 11 may be understood as performed by the electronic device 101 or a constituent element (e.g., the processor 120 or the EM sensing circuit 820) of the electronic device 101.

Referring to FIG. 11, the electronic device 101 (e.g., the processor 120) may acquire a first signal and a second signal in operation 1101. For example, the first signal may be acquired from a signal received through the upper antenna 1010*a*, and the second signal may be acquired from a signal received through the lower antenna 1010*b*.

In operation 1103, the electronic device 101 may determine whether a condition for performing a subtraction operation using the second signal is satisfied. For example, the condition may be defined to distinguish that both the upper antenna 1010*a* and the lower antenna 1010*b* receive an EM signal. The condition may be defined on the basis of a similarity between the first signal and the second signal and/or an angle between an external electronic device and the electronic device 101. In accordance with an embodiment, that measured signals are similar indicates a possibility in which an EM signal of a measurement target is included is great, so the electronic device 101 may determine whether the similarity between the first signal and the second signal exceeds a threshold.

In response to the condition being satisfied, in operation 1105, the electronic device 101 may provide a signal pattern by using the first signal and the second signal. By subtracting the second signal from the first signal, the electronic device 101 may provide the signal pattern representing an EM signal of the external electronic device.

In response to the condition not being satisfied, in operation 1107, the electronic device 101 may provide a signal pattern by using a specified noise signal. By subtracting the specified noise signal from the first signal, the electronic device 101 may provide the signal pattern representing an EM signal of the external electronic device. In an embodiment, the electronic device 101 may not use any one of the signals acquired through the upper antenna 1010*a* and the lower antenna 1010*b*. For example, in response to signals received by the upper antenna 1010*a* and the lower antenna 1010*b* being similar, the electronic device 101 may select one of the plurality of measured signals according to a grip state or an angle thereof. In an embodiment, in consideration of a state of the electronic device 101, the electronic device 101 may adopt a signal collected from an antenna that is adjacent to a measurement target and select the signal as an analysis target. As such, in response to analyzing a signal measured from one antenna (e.g., the upper antenna 1010*a*), the electronic device 101 may correct the measured signal by using a specified self noise DB and/or ambient noise DB, thereby minimizing an error. For example, the specified self noise DB may be a data set previously measuring a self noise providable from the electronic device 101, and the ambient noise DB may be a data set previously measuring a noise provided on a per-measurement-position or place basis.

As described with reference to FIG. 11, a subtraction operation using a second signal may be performed adaptively. Further to adaptively performing the subtraction operation, a weight applied to the second signal at a subtraction operation may be adjusted. An embodiment using the weight is explained below with reference to FIGS. 12, 13A, and 13B.

Figure 12:
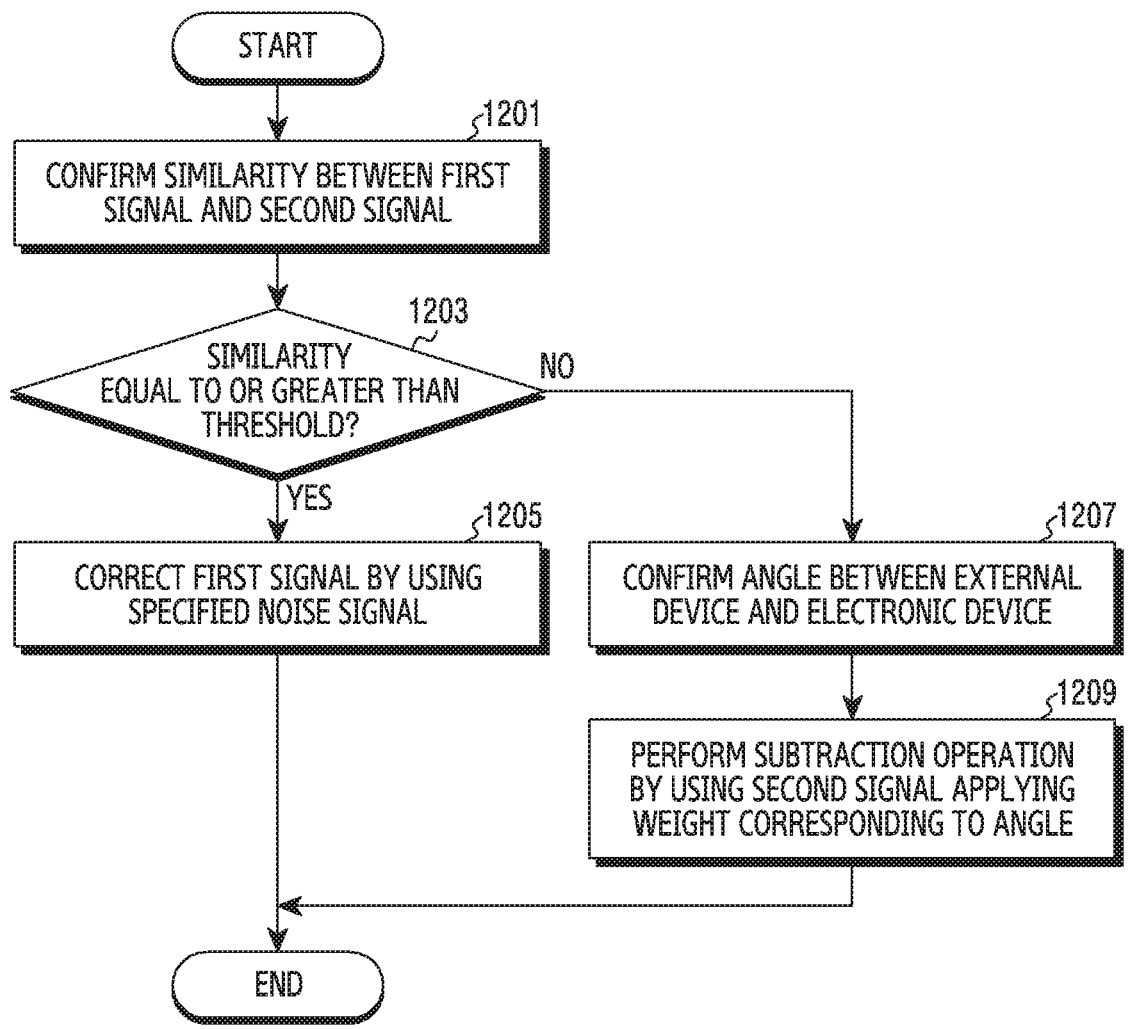
FIG. 12 is a flowchart for providing activation or non-activation of a subtraction operation that uses a measured signal in an electronic device according to an embodiment of the disclosure.

FIG. 12 is a flowchart for providing the activation or non-activation of a subtraction operation that uses a measured signal in an electronic device according to an embodiment of the disclosure.

Figure 13A:
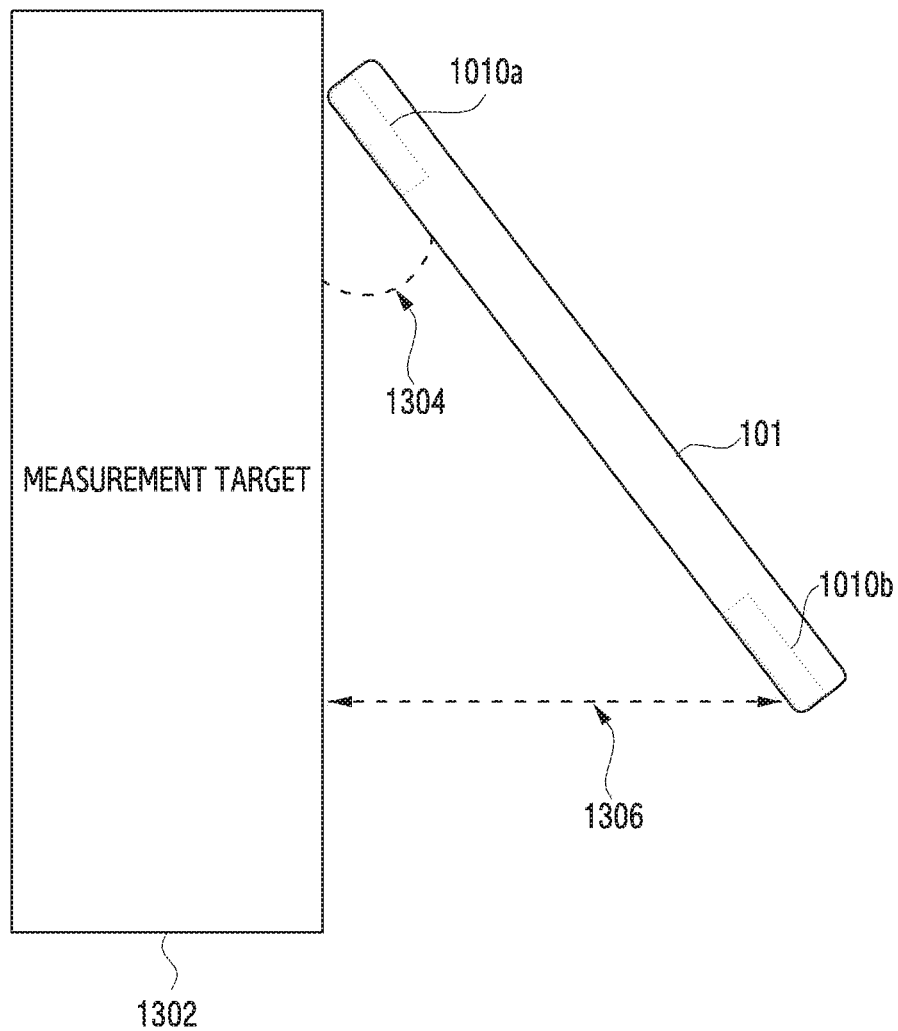
FIG. 13A is an arrangement of an electronic device and a target device at the time of EM signal measurement according to an embodiment of the disclosure.

FIG. 13A is an arrangement of an electronic device and a target device at the time of EM signal measurement according to an embodiment of the disclosure.

Figure 13B:
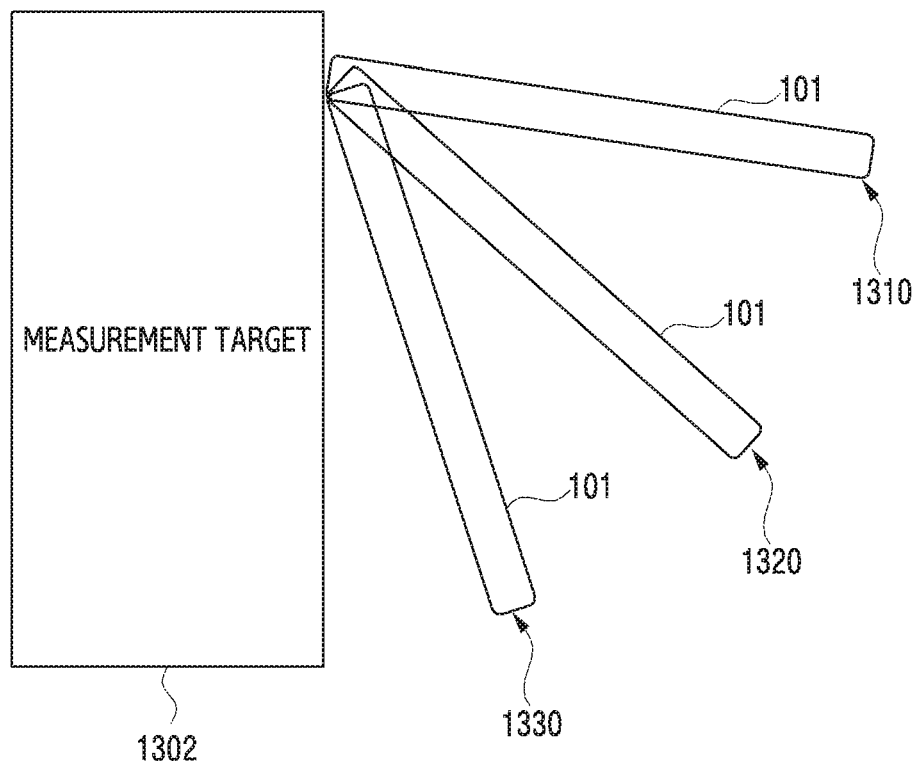
FIG. 13B is an example of postures of an electronic device with respect to a measurement target device at the time of EM signal measurement according to an embodiment of the disclosure.

FIG. 13B is an example of postures of an electronic device with respect to a measurement target device at the time of EM signal measurement according to an embodiment of the disclosure. An operation illustrated in the flowchart of FIG. 12 may be understood as performed by the electronic device 101 or a constituent element (e.g., the processor 120 or the EM sensing circuit 820) of the electronic device 101.

Referring to FIG. 12, the electronic device 101 (e.g., the processor 120) may confirm a similarity between a first signal and a second signal in operation 1201. For example, by performing a correlation operation between the first signal and the second signal, the electronic device 101 may obtain the similarity.

In operation 1203, the electronic device 101 may determine whether the similarity is equal to or is greater than a threshold. In response to the similarity being equal to or being greater than the threshold, the electronic device 101 may determine that an EM signal of an external electronic device is included in both the first signal and the second signal.

In response to the similarity being equal to or being greater than the threshold, in operation 1205, the electronic device 101 may correct the first signal by using a specified noise signal. For example, by subtracting the specified noise signal from the first signal, the electronic device 101 may provide a signal pattern representing an EM signal of the external electronic device.

In response to the similarity being not equal to or greater than the threshold, in operation 1207, the electronic device 101 may confirm an angle between the external electronic device (e.g., the electronic device 102) and the electronic device 101. To confirm the angle, the electronic device 101 may use a measurement value of a sensor (e.g., the sensor module 176).

Referring to FIG. 13A, the electronic device 101 may confirm an angle 1304 between the electronic device 101 and a measurement target 1302. In accordance with another embodiment, the angle 1304 may be replaced with a distance 1306 between the lower antenna 1010*b* and the measurement target 1302.

In operation 1209, the electronic device 101 may perform a subtraction operation by using the second signal applying a weight corresponding to the angle 1304. For example, that the angle 1304 is small indicates a possibility in which the second signal includes the EM signal of the external electronic device is great, so the weight may be reduced as the angle 1304 is small. In accordance with another embodiment, the electronic device 101 may use the distance 1306 instead of the angle 1304. In this case, the weight may be reduced as the distance 1306 is small.

Referring to FIG. 13B, postures of the electronic device 101 with respect to the measurement target 1302 may be classified. For example, as the angle 1304 is decreased, a posture of the electronic device 101 may be defined as a first measurement posture 1310, a second measurement posture 1320, and a third measurement posture 1330. For example, in response to the third measurement posture 1330, the second signal may include a unique signal of the measurement target 1302, so the electronic device 101 may set the weight for the second signal small or set the weight as 0. In accordance with various embodiments, in response to the weight for the second signal being set as 0, the electronic device 101 may perform a subtraction operation by using a previously stored ambient noise or self noise signal.

Various states of the electronic device 110 may be determined through an acceleration sensor, a gyro sensor, a proximity sensor, and/or grip information. Also, in accordance with various embodiments, in the first measurement posture 1310, a unique signal of the measurement target 1302 is not included in the second signal, so the electronic device 101 may set the weight as a maximal value (e.g., 1). In accordance with various embodiments, in response to the unique signal of the measurement target 1302 being partially included in the second signal (e.g., the second measurement posture 1320), the electronic device 101 may subtract the second signal corrected with the weight from the first signal, thereby improving accuracy as compared with measuring with only the first signal. In response to the measurement using the aforementioned weight being expressed in an equation, it is given as in Equation 2 below.

$$S_{measure}=S_1-w\cdot S_2 \quad\quad\quad \text{Equation 2}$$

In Equation 2, the variable $S_{measure}$ refers to a final measurement signal value, the variable $S_1$ refers to the first signal, the variable $S_2$ refers to the second signal, and the variable w refers to the weight.

As in an embodiment explained with reference to FIG. 12, FIG. 13A and FIG. 13B, the electronic device 101 may adjust the weight for the subtracted second signal on the basis of the angle and/or distance with the external electronic device. For example, for the sake of effective measurement of the EM signal, the weight may be set high, on the assumption that the second signal does not include the EM signal. In accordance with an embodiment, the electronic device 101 may provide guide information to a user wherein the electronic device 101 and the external electronic device form an appropriate angle therebetween. For example, the guide information may include a text character, a graphic, and/or an image, and may be displayed through a display device (e.g., the display device 160 of FIG. 1). For another example, the guide information may have an auditory form including a warning sound, and may be outputted through a sound output device (e.g., the sound output device 155 of FIG. 1).

In accordance with an embodiment, the electronic device 101 may output the guide information on the basis of a signal received through the first antenna 1010*a*. In accordance with another embodiment, the electronic device 101 may output the guide information, on the basis of a similarity between a first signal acquired through the first antenna 1010*a* and a second signal acquired through the second antenna 1010*b* being equal to or is greater than a threshold, or on the basis of an angle or distance between the electronic device 101 and the external electronic device being equal to or is less than a threshold. Additionally, the electronic device 101 may output guide information (e.g., a screen or guide sound) indicating that a sufficient angle or distance has been secured.

Figure 14A:
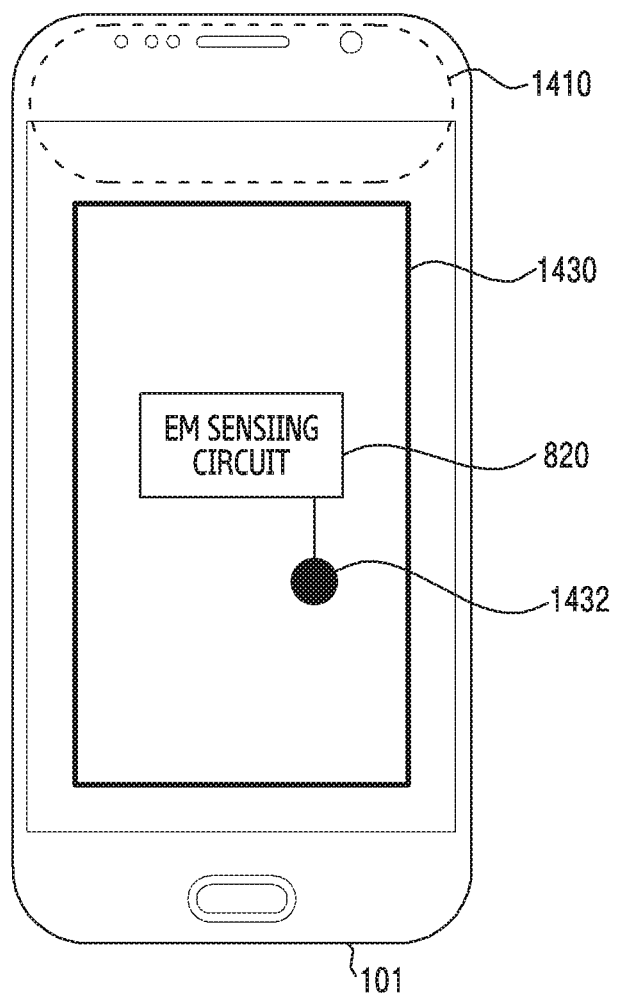
FIG. 14A is an example of conducting units implemented with an antenna and a ground circuit in an electronic device according to an embodiment of the disclosure.

FIG. 14A is an example of conducting units implemented with an antenna and a ground circuit in an electronic device according to an embodiment of the disclosure.

Referring to FIG. 14A, the conducting units (e.g., the first conducting unit 810*a* and the second conducting unit 810*b*) for receiving a signal may be implemented with an antenna 1410 and a ground circuit 1432. The antenna 1410 may simultaneously receive a unique EM signal of an external electronic device (e.g., the electronic device 102) being a measurement target, and a self noise and/or ambient noise. The ground circuit 1432 connected to a specific portion of an internal circuit substrate 1430 may measure the self noise. For example, the antenna 1410 may be installed in a specific region including an upper end, a middle end, or a lower end of the electronic device 101. The ground circuit 1432 may be connected to a position capable of measuring the self noise of the electronic device 101, and the EM sensing circuit 820 may measure the self noise through the ground circuit 1432. By subtracting the second signal collected through the ground circuit 1432 from the first signal collected through the antenna 1410, the electronic device 101 may cancel the self noise. A connection position of the ground circuit 1432 and the internal circuit substrate 1430 may be a ground point near the EM sensing circuit 820, or be an isolated ground point not having influence from the antenna 1410.

A basis of a subtraction operation using the ground circuit 1432 is illustrated below through FIG. 14B.

Figure 14B:
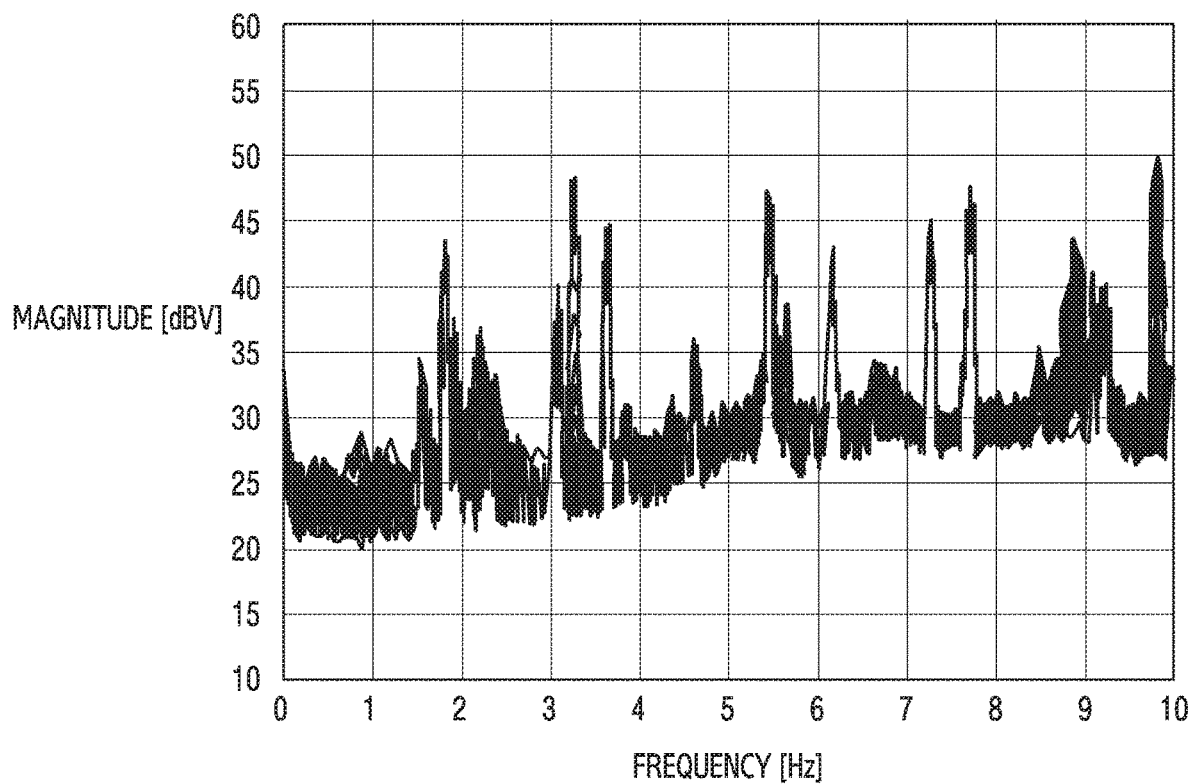
FIG. 14B is an example of a noise obtained in an electronic device according to an embodiment of the disclosure.

FIG. 14B is an example of a noise obtained in an electronic device according to an embodiment of the disclosure.

Referring to FIG. 14B, a signal obtained using the ground circuit 1432 of FIG. 14A is illustrated. That is, FIG. 14B illustrates a signal measured at a specific point (e.g., the ground circuit 1432) of a circuit in a shield space (e.g., a shield room) where an external noise does not exist. It is a measurement result in an environment isolated from the external noise, so the signal expressed in FIG. 14B may be understood as an internal noise. Particularly, referring to FIG. 14B, a plurality of peak points are observed. The peak points, harmonic components of about 181.6 KHz or harmonic components of about 156 KHz, may be harmonic components of a noise signal provided from a display installed in the electronic device 101 or a direct current (DC)-DC converter. As such, the self noise is able to be measured in a specific position of the internal circuit substrate 1430.

According to various embodiments of the disclosure, an operation method of an electronic device (e.g., the electronic device 101) may include acquiring a first signal which includes an EM signal radiated from an external electronic device (e.g., the electronic device 102) and a noise, by using a first conducting unit (e.g., the first conducting unit 810a), and acquiring a second signal which includes at least part of the noise, by using a second conducting unit (e.g., the second conducting unit 810b), and measuring the EM signal by subtracting the second signal from the first signal.

According to various embodiments of the disclosure, the noise may include at least one of a self noise provided from the electronic device (e.g., the electronic device 101) or an ambient noise provided from the external.

According to various embodiments of the disclosure, measuring the EM signal by subtracting the second signal from the first signal may include, in response to a similarity between the first signal and the second signal being less than a threshold, subtracting the second signal from the first signal.

According to various embodiments of the disclosure, measuring the EM signal by subtracting the second signal from the first signal may include providing a weight applied to the second signal on the basis of an angle or distance between the electronic device (e.g., the electronic device 101) and the external electronic device (e.g., the electronic device 102).

According to various embodiments of the disclosure, the operation method may further include outputting guide information about an angle between the electronic device (e.g., the electronic device 101) and the external electronic device (e.g., the electronic device 102).

An electronic device of various embodiments disclosed in the document may be devices of various forms. The electronic device may include, for example, a portable communication device (e.g., a smart phone), a computer device, a portable multimedia device, a portable medical device, a camera, a wearable device, or a home appliance. The electronic device of an embodiment of the disclosure is not limited to the aforementioned devices.

Various embodiments of the disclosure and the terms used herein are not to limit technological features mentioned in the disclosure to specific embodiments, and should be construed as including various changes, equivalents, and/or alternatives of a corresponding embodiment. With regard to the description of the drawings, similar reference symbols may be used to refer to similar or related constituent elements. A singular form of a noun corresponding to an item may include one item or a plurality of items, unless the relevant context clearly indicates otherwise. In the disclosure, each of phrases such as "A or B", "at least one of A and B", "at least one of A or B," "A, B, or C", "at least one of A, B, and C", and "at least one of A, B, or C" may include any one of the items enumerated together in a corresponding one of the phrases or all available combinations thereof. Such terms as "a first", "a second", or "the first" or "the second" may be used to simply distinguish a corresponding constituent element from another corresponding constituent element, and does not limit the corresponding constituent elements in another aspect (e.g., importance or sequence). When an element (e.g., a first element) is referred to, with or without the term "operatively" or "communicatively", as "coupled with," "coupled to", "connected with", or "connected to" another element (e.g., a second element), it means that the element may be coupled with the other element directly (e.g., wiredly), wirelessly, or via a third element.

The term "module" used in the disclosure may include a unit implemented as hardware, software, or firmware, and may interchangeably be used with terms, for example, logic, logic block, part, or circuitry. A module may be a single integral component, or a minimum unit of the component or part thereof, adapted to perform one or more functions. For example, according to an embodiment, the module may be implemented in a form of an application-specific integrated circuit (ASIC).

Various embodiments of the disclosure may be implemented as software (e.g., the program 140) that includes one or more instructions that are stored in a storage medium (e.g., the internal memory 136 or the external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an EM wave), but this term does not differentiate between where data is semi-permanently stored in the storage medium and where the data is temporarily stored in the storage medium.

According to an embodiment, a method of various embodiments disclosed in the disclosure may be included in a computer program product and provided. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as a memory of a manufacturer's server, a server of the application store, or a relay server.

According to various embodiments, each element (e.g., a module or a program) of the above-described elements may include a single entity or multiple entities. According to various embodiments, one or more elements or operations among the above-described corresponding elements may be omitted, or one or more other elements or operations may be added. Alternatively or additionally, a plurality of elements (e.g., modules or programs) may be integrated into a single element. In such a case, the integrated element may still perform one or more functions of each of the plurality of elements in the same or similar manner as they are performed by a corresponding one of the plurality of elements before the integration. According to various embodiments, operations performed by the module, the program, or another element may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
    a housing including a first surface facing in a first direction, a second surface facing in a second direction opposite to the first direction, and a side member surrounding at least part of a space between the first surface and the second surface;
    a display configured to be shown through at least a part of the first surface;
    a first conducting unit configured to be arranged in the housing or the space;
    a second conducting unit configured to be arranged at a distance from the first conducting unit, in the housing or the space;
    at least one electromagnetic (EM) sensing circuit configured to be arranged in the housing, to be electrically or operatively connected with the first conducting unit and the second conducting unit, and to sense an EM signal;
    at least one wireless communication circuit;
    at least one processor configured to be arranged in the housing, and be operatively connected with the display, the EM sensing circuit, and the wireless communication circuit; and
    a memory configured to be operatively connected with the at least one processor,
    wherein the memory stores instructions of, when being executed, enabling the at least one processor to:
        receive, by using the first conducting unit, a first signal sensed by the EM sensing circuit,
        receive, by using the second conducting unit, a second signal sensed by the EM sensing circuit,
        determine a signal pattern on the basis of the first signal and the second signal, and
        identify an external electronic device, at least partially on the basis of the signal pattern.

2. The electronic device of claim 1, wherein the first conducting unit is comprised in the side member.

3. The electronic device of claim 1, wherein the second conducting unit is comprised in the side member.

4. The electronic device of claim 1, wherein the second conducting unit is electrically connected with a ground member arranged in the housing.

5. The electronic device of claim 1, wherein the first signal comprises an EM signal provided from the external electronic device, and further comprises at least one of an EM signal provided from the electronic device or an external ambient noise.

6. The electronic device of claim 1, wherein the second signal comprises at least one of an EM signal provided from the electronic device or an external ambient noise.

7. The electronic device of claim 1, wherein the instructions enable the at least one processor to determine the signal pattern by offsetting the second signal from the first signal.

8. The electronic device of claim 1, wherein the instructions enable the at least one processor to:
    determine whether to use the second signal on the basis of a similarity between the first signal and the second signal; and
    in response to not using the second signal, determine the signal pattern by using the first signal and a specified noise signal.

9. The electronic device of claim 1, wherein the instructions enable the at least one processor to:
    determine a weight applied to the second signal, on the basis of an angle or a distance between the external electronic device and the electronic device; and
    determine the signal pattern by offsetting the second signal applying the weight from the first signal.

10. The electronic device of claim 9, wherein the weight is reduced as the angle or the distance is reduced.

11. An electronic device comprising:
    a first conducting unit configured to acquire a first signal which comprises an electromagnetic (EM) signal radiated from an external electronic device and a noise;
    a second conducting unit configured to acquire a second signal which comprises at least part of the noise; and
    an EM sensing circuit configured to be electrically or operatively connected with the first conducting unit and the second conducting unit, and to measure the EM signal by subtracting the second signal from the first signal.

12. The electronic device of claim 11,
    wherein the first conducting unit comprises a first antenna installed in an upper end of the electronic device, and
    wherein the second conducting unit comprises a second antenna installed in a lower end of the electronic device.

13. The electronic device of claim 11,
    wherein the first conducting unit comprises an antenna installed in an upper end of the electronic device, and
    wherein the second conducting unit comprises a ground circuit connected to the ground of an internal circuit substrate of the electronic device.

14. The electronic device of claim 11, wherein the EM sensing circuit comprises:
    a first sensor of a 1-channel structure configured to process the first signal;
    a second sensor of a 1-channel structure configured to process the second signal; and
    an operation unit configured to perform a subtraction operation between the first signal and the second signal.

15. The electronic device of claim 11, wherein the EM sensing circuit comprises a sensor of a 2-channel structure configured to process the first signal and the second signal, and to perform a subtraction operation between the first signal and the second signal.

16. An operation method of an electronic device, the method comprising:
    acquiring a first signal which comprises an electromagnetic (EM) signal radiated from an external electronic device and a noise, by using a first conducting unit;

acquiring a second signal which comprises at least part of the noise, by using a second conducting unit; and measuring the EM signal by subtracting the second signal from the first signal.

17. The method of claim 16, wherein the noise comprises at least one of a self noise provided from the electronic device or an ambient noise provided from an external source.

18. The method of claim 16, wherein the measuring of the EM signal by subtracting the second signal from the first signal comprises, in response to a similarity between the first signal and the second signal being less than a threshold, subtracting the second signal from the first signal.

19. The method of claim 16, wherein the measuring of the EM signal by subtracting the second signal from the first signal comprises providing a weight applied to the second signal on the basis of an angle or distance between the electronic device and the external electronic device.

20. The method of claim 16, further comprising outputting guide information about an angle between the electronic device and the external electronic device.

\* \* \* \* \*